US006717651B2

(12) United States Patent
Kato et al.

(10) Patent No.: US 6,717,651 B2
(45) Date of Patent: Apr. 6, 2004

(54) EXPOSURE APPARATUS, METHOD FOR MANUFACTURING THEREOF AND METHOD FOR MANUFACTURING MICRODEVICE

(75) Inventors: Masaki Kato, Chiyoda-ku (JP); Tetsuo Kikuchi, Chiyoda-ku (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/828,914

(22) Filed: Apr. 10, 2001

(65) Prior Publication Data

US 2002/0054283 A1 May 9, 2002

(30) Foreign Application Priority Data

Apr. 12, 2000 (JP) ........................................ 2000-110529
Apr. 26, 2000 (JP) ........................................ 2000-125126

(51) Int. Cl.⁷ ........................ G03B 27/52; G03B 27/42; G03B 27/54
(52) U.S. Cl. .............................. 355/55; 355/53; 355/67
(58) Field of Search ................. 355/52–53, 55, 355/67–71, 77; 356/399–401; 250/548; 359/720, 763

(56) References Cited

U.S. PATENT DOCUMENTS

| 4,668,077 A | * | 5/1987 | Tanaka ......................... 355/30 |
| 4,780,747 A | * | 10/1988 | Suzuki et al. ................. 355/68 |
| 4,947,030 A | | 8/1990 | Takahashi ................. 250/201.1 |
| 5,461,456 A | | 10/1995 | Michaloski |
| 5,473,410 A | * | 12/1995 | Nishi ........................... 355/53 |
| 5,486,896 A | | 1/1996 | Hazama et al. ................. 355/71 |
| 5,591,958 A | * | 1/1997 | Nishi et al. .................. 250/205 |
| 5,677,754 A | * | 10/1997 | Makinouchi .................. 355/53 |
| 5,696,631 A | | 12/1997 | Hoffman ..................... 359/649 |
| 5,721,608 A | * | 2/1998 | Taniguchi ..................... 355/53 |
| 5,982,558 A | | 11/1999 | Furter et al. |
| 6,213,607 B1 | | 4/2001 | Watanabe et al. ........... 359/601 |
| 6,295,122 B1 | | 9/2001 | Schultz et al. ................ 355/67 |
| 6,501,535 B1 | * | 12/2002 | Ozawa ......................... 355/68 |
| 2001/0012101 A1 | | 8/2001 | Mulkens ....................... 355/67 |

FOREIGN PATENT DOCUMENTS

| JP | A 11-329963 | 11/1999 |
| JP | A 2000-137162 | 5/2000 |

* cited by examiner

Primary Examiner—Henry Hung Nguyen
(74) Attorney, Agent, or Firm—Oliff & Berridge PLC

(57) ABSTRACT

An exposure apparatus exposes a transfer pattern of a mask onto a photosensitive substrate in an overlapping manner. The exposure apparatus includes an illumination optical system for guiding illumination light to the mask. An imaging optical system in the illumination optical system forms an illumination area on the mask. The exposure apparatus includes a lens driving apparatus. The lens driving apparatus moves at least one of the lenses constituting the imaging optical system along the optical axis and so forth, thereby correcting an optical characteristic of the imaging optical system.

49 Claims, 16 Drawing Sheets

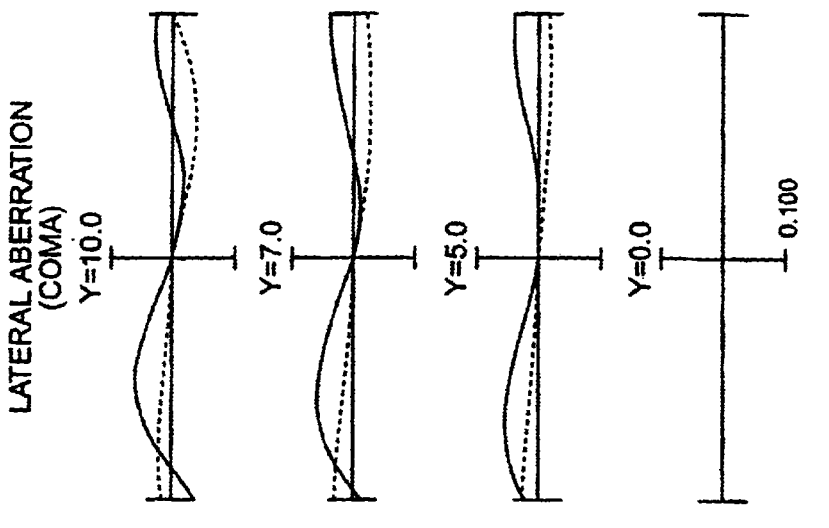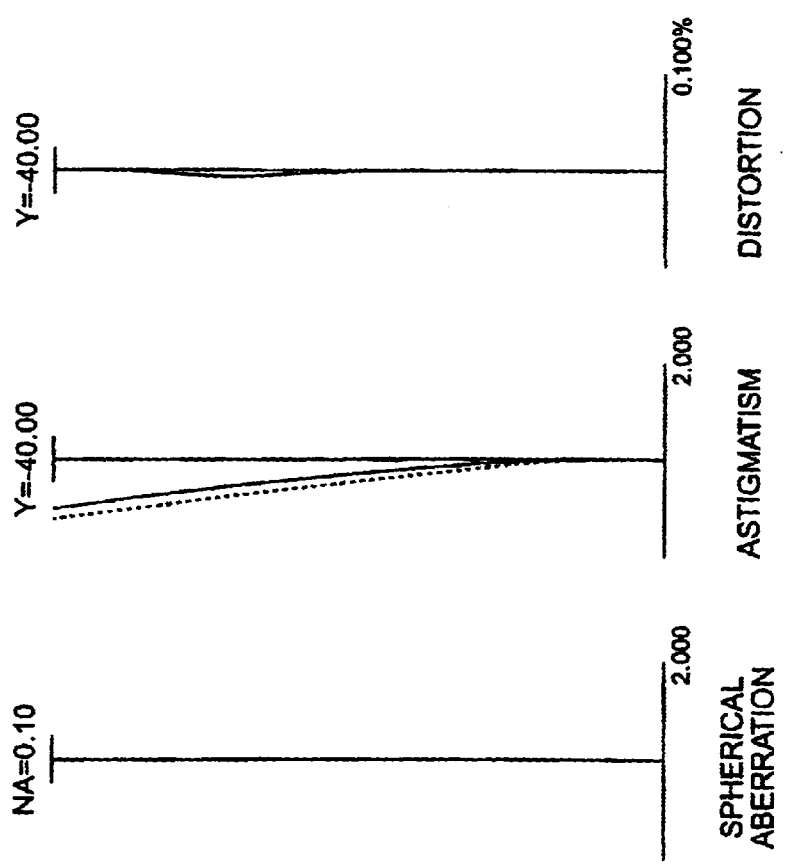

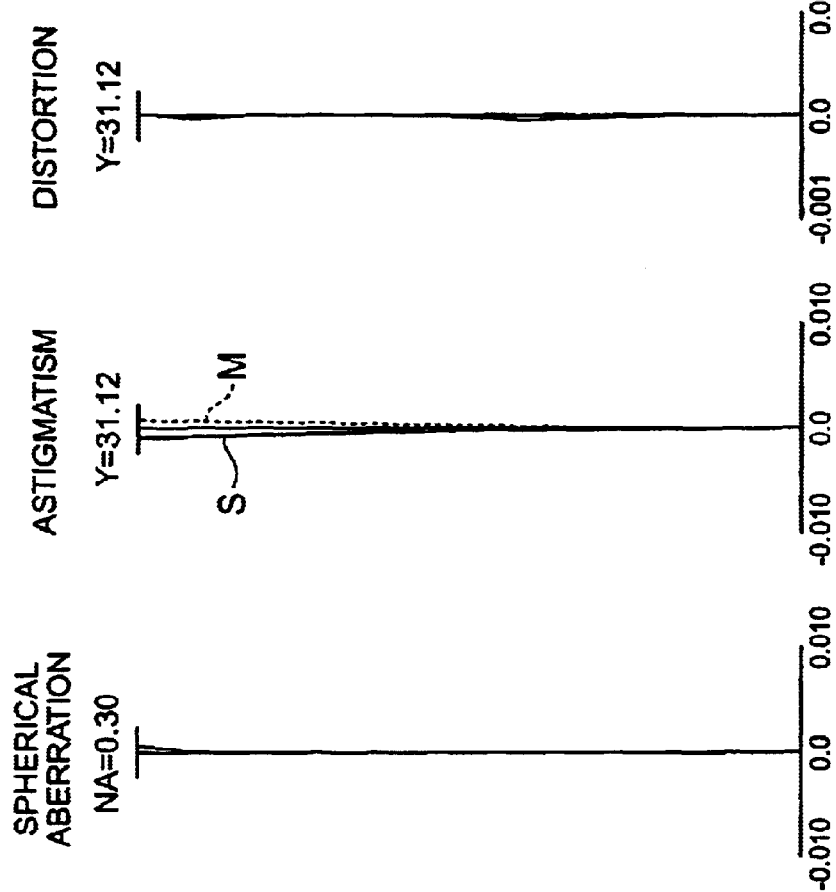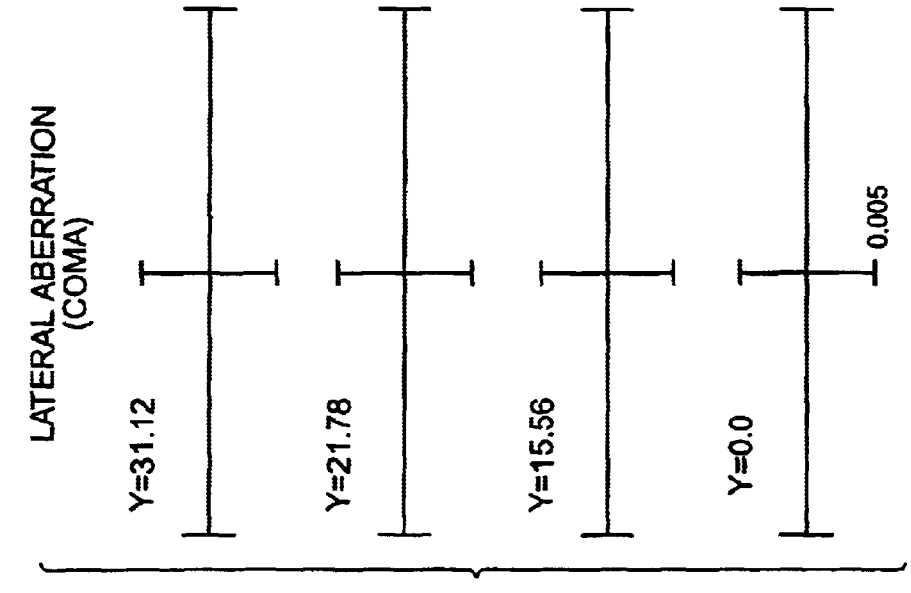

EXPOSURE APPARATUS, METHOD FOR MANUFACTURING THEREOF AND METHOD FOR MANUFACTURING MICRODEVICE

BACKGROUND OF THE INVENTION

1. Field of the Invention

The present invention relates to an exposure apparatus used for manufacturing a microdevice such as a semiconductor device or liquid crystal display device, a method of manufacturing a microdevice by using the exposure apparatus, and a method of manufacturing the exposure apparatus.

2. Related Background Art

One of microdevice manufacturing steps is an exposure step. Microdevices include those having a larger size such as liquid crystal display devices, for example. For exposure of such a microdevice, a screen synthesizing technique is used. In the screen synthesizing technique, the exposure area of a photosensitive substrate to be exposed is divided into a plurality of unit exposure areas, and exposure operations corresponding to the individual unit exposure areas are repeated, whereby a desirable pattern is finally synthesized. In the screen synthesizing technique, overlapping exposure is used in order to prevent the pattern from breaking at boundary positions of the individual unit exposure areas due to drawing errors of a reticle (mask) for projecting the pattern, distortions of projection optical systems, positioning errors of stages for positioning the photosensitive substrate, and the like. The overlapping exposure refers to exposure operations carried out such that unit exposure areas overlap each other, more specifically, edge portions adjacent each other between the unit exposure areas overlap each other. Among the unit exposure areas, parts exposed twice or more such as these edge portions are referred to as overlapping exposure parts, whereas those exposed only once are referred to as non-overlapping exposure parts.

If exposure is carried out such that edge portions adjacent each other are simply caused to overlap each other, the amount of exposure in the overlapping exposure parts will be twice or more that of the non-overlapping exposure parts, whereby the line width of junctures in the pattern may vary depending on characteristics of photosensitive agents. Also, when screen synthesizing is carried out, differences in level may occur at junctures of the pattern due to positional deviations between adjacent unit exposure areas, whereby characteristics of the device may deteriorate. When steps for superposing screen-synthesized single layer patterns in a multilayer manner are allocated to different exposure apparatus, respectively, overlapping errors of unit exposure areas in the individual layers change discontinuously at junctures of the pattern due to differences in lens distortion and positioning errors of stages among the exposure apparatus. Due to the discontinuous changes at junctures, contrast may discontinuously vary at pattern junctures in active matrix liquid crystal devices in particular, whereby the quality of device may deteriorate.

An exposure apparatus which can eliminate the foregoing inconveniences in screen synthesizing is disclosed in Japanese Patent Application Laid-Open No. HEI 6-302501, for example. In the exposure apparatus disclosed in this publication, a function capable of controlling the amount of exposure so as to yield a desirable pattern is added to a reticle blind section for determining the exposure size. This reticle blind function capable of controlling the amount of exposure is used for gradually changing the amount of exposure at overlapping exposure parts when forming an optical image such that pattern images partly overlap each other with respect to different areas on the photosensitive substrate, so as to eliminate the above-mentioned inconveniences.

Further, in the exposure apparatus disclosed in Japanese Patent Application Laid-Open Nos. HEI 6-244077 and 7-235466, a reticle blind disposed at a position substantially conjugate with a reticle is formed with a light-attenuating portion having a width of several millimeters in which transmissivity changes from 100% to 0% from the center to the outside. The overlapping exposure parts are exposed by way of the light-attenuating portion, so that the amount of exposure at the overlapping exposure parts and that at the non-overlapping exposure parts substantially equal each other.

In the exposure apparatus disclosed in Japanese Patent Application Laid-Open No. HEI 7-235466 in particular, in a light-attenuating portion formed between a light-shielding portion and an opening, a light-shielding member is formed so as to increase its density toward the light-shielding portion. More specifically, in the light-attenuating portion, a dot-like Cr (chromium) pattern having a size not greater than the limit resolution of the exposure apparatus is arranged on a glass substrate so as to increase its density toward the light-shielding portion. Also, the reticle blind is scanned at a substantially constant speed during exposure, so as to effect control such that a substantially uniform exposure amount is finally obtained throughout the overlapping exposure parts.

When no overlapping exposure is carried out, it will be sufficient if optical aberrations, setting errors, and the like in a blind imaging optical system (relay optical system for projecting the opening of a reticle blind onto a reticle) are set to influence only the inside of the light-shielding zone in the reticle if any. Therefore, while hardly adjusting aberrations in the blind imaging optical system in the illumination system, only the focusing at the time of forming an image of the opening of the reticle blind onto the reticle is adjusted.

When carrying out overlapping exposure by scanning a reticle blind, however, the illumination area on the reticle must be defined by way of linear edges of the reticle blind, for example. Therefore, it is important that blind edge images on the reticle be linear and kept from inclining with respect to a horizontal or vertical direction. For example, if distortion occurs in the blind imaging optical system (relay optical system for projecting the opening of a reticle blind onto a reticle) within the illumination optical system when overlapping exposure is carried out by first and second exposure operations, the width in overlapping exposure parts becomes uneven under the influence of distortion, whereby the amount of exposure in the overlapping exposure parts becomes uneven.

Though the distortion is exemplified in the foregoing, the amount of exposure also becomes uneven in overlapping exposure parts when other aberrations exist in the blind imaging optical system. Namely, the degree of defocusing of images varies depending on the image height of the blind imaging optical system due to aberrations such as coma, spherical aberration, curvature of field, and astigmatism. As a consequence, the illuminance in overlapping exposure parts becomes uneven, whereby unevenness occurs in the amount of exposure. Also, so-called eccentric aberration occurring due to the eccentricity of optical members within the blind imaging optical system or the like causes the amount of exposure in the overlapping exposure parts to become uneven as with the above-mentioned aberrations.

When overlapping exposure is carried out while changing the illuminance substantially linearly by way of a light-attenuating portion having the above-mentioned transmissivity distribution, the magnification between the reticle blind and the reticle, i.e., the imaging magnification of the blind imaging optical system is also important. On the reticle, an overlapping illumination portion having a width optically corresponding to the width of an overlapping exposure part to be overlapped is patterned beforehand. If the magnification of the blind imaging optical system substantially differs from its designed value, however, the width of the overlapping illumination area on the reticle may become smaller or greater than its set value (designed value). As a result, desirable overlapping exposure may not be carried out.

Even when no overlapping exposure is carried out, as in normal projection exposure under demagnification, for example, the amount of exposure becomes uneven in the exposure area if optical aberrations, setting errors, and the like occur in the blind imaging optical system, thereby failing to form a desirable pattern.

SUMMARY OF THE INVENTION

In view of the problems mentioned above, it is an object of the present invention to provide an exposure apparatus which can lower the unevenness in the amount of exposure in overlapping exposure parts and a method of manufacturing the same.

It is another object of the present invention to provide a method which can manufacture a favorable microdevice (semiconductor device, liquid crystal display device, thin film magnetic head, or the like) having a large area upon overlapping exposure by using the exposure apparatus of the present invention.

It is still another object of the present invention to provide an exposure apparatus which can lower the unevenness in amount of exposure in exposure areas, a method of manufacturing the same, and a method of manufacturing a favorable microdevice having a large area by using the exposure apparatus of the present invention.

In one aspect, the present invention provides an exposure apparatus for exposing a transfer pattern of a mask onto a photosensitive substrate in an overlapping manner, so as to expose a pattern larger than the transfer pattern of the mask onto the photosensitive substrate; the exposure apparatus comprising a light source unit for supplying illumination light and an illumination optical system for guiding the illumination light to the mask having the transfer pattern; the illumination optical system comprising an illumination area defining unit, disposed at a position substantially optically conjugate with the mask, for defining a predetermined area corresponding to an illumination area to be formed on the mask, and an imaging optical system for forming the illumination area on the mask by projecting the predetermined area defined by the illumination area defining unit onto the mask; the exposure apparatus further comprising an adjusting unit for adjusting an optical characteristic in the illumination area formed on the mask or in an exposure area formed on the photosensitive substrate.

In another aspect, the present invention provides an exposure apparatus for exposing a transfer pattern of a mask onto a photosensitive substrate; the exposure apparatus comprising a light source unit for supplying illumination light, an illumination optical system for guiding the illumination light supplied by the light source unit to the mask having the transfer pattern, and a projection optical system for projecting an image of the transfer pattern of the mask onto an exposure area formed on the photosensitive substrate; the illumination optical system comprising an illumination area defining unit, disposed at a position substantially optically conjugate with the mask, for defining a predetermined area corresponding to an illumination area to be formed on the mask, and an imaging optical system for forming the illumination area on the mask by projecting the predetermined area defined by the illumination area defining unit onto the mask; the exposure apparatus further comprising an adjusting unit for adjusting an optical characteristic in the illumination area formed on the mask or in the exposure area formed on the photosensitive substrate; the exposure apparatus satisfying an expression of $0.01<NA1/(NA2\times\beta)<6$, where NA1 is the maximum numerical aperture of the imaging optical system on the illumination area defining unit side, $\beta$ is the absolute value of imaging magnification of the imaging optical system, and NA2 is the maximum numerical aperture of the projection optical system on the photosensitive substrate side.

In still another aspect, the present invention provides an exposure apparatus comprising an illumination optical system including an illumination area forming optical system for forming an illumination area on a mask having a predetermined pattern, a projection optical system for projecting a pattern image of the mask onto a photosensitive substrate, and an adjusting unit for adjusting the illumination optical system; the exposure apparatus satisfying an expression of $0.01<NA1/(NA2\times\beta)<6$, where NA1 is the maximum numerical aperture of the illumination area forming optical system on the light source side, $\beta$ is the imaging magnification of the illumination area forming optical system, and NA2 is the maximum numerical aperture of the projection optical system on the photosensitive substrate side.

In still another aspect, the present invention provides a method of manufacturing a microdevice using the exposure apparatus in accordance with the present invention; the method comprising an illumination step of illuminating the mask with the illumination optical system, and an exposure step of exposing a transfer pattern formed in the mask onto the photosensitive substrate.

In still another aspect, the present invention provides a method of manufacturing a microdevice; the method comprising an illumination step of illuminating a mask having a transfer pattern with illumination light, and an exposure step of exposing the transfer pattern of the mask onto a photosensitive substrate in an overlapping manner; the illumination step including an illumination area defining step of defining a predetermined area corresponding to an illumination area to be formed on a mask at a position substantially optically conjugate with the mask, and an illumination area forming step of forming the illumination area on the mask by projecting the predetermined area onto the mask by using an imaging optical system; the method further comprising an adjusting step for adjusting an optical characteristic of the imaging optical system prior to the exposure step.

In still another aspect, the present invention provides a method of manufacturing a microdevice; the method comprising an illumination step of illuminating a mask having a transfer pattern with illumination light, and an exposure step of exposing the transfer pattern of the mask onto a photosensitive substrate; the exposure step including a projection step of projecting an image of the transfer pattern of the mask onto the photosensitive substrate by using a projection optical system; the illumination step including an illumination area defining step of defining a predetermined area corresponding to an illumination area to be formed on the mask at a position substantially optically conjugate with the mask, and an illumination area forming step of forming the illumination area on the mask by projecting the predetermined area onto the mask by using an imaging optical system; the method satisfying an expression of $0.01<NA1/(NA2\times\beta)<6$, where NA1 is the maximum numerical aperture of the imaging optical system on a side opposite from the mask side, $\beta$ is the absolute value of imaging magnification of the imaging optical system, and NA2 is the maximum numerical aperture of the projection optical system on the photosensitive substrate side; the method further comprising an adjusting step of adjusting an optical characteristic of the imaging optical system prior to the exposure step.

In still another aspect, the present invention provides a method of manufacturing a microdevice; the method comprising a step of illuminating a mask having a predetermined pattern by using an illumination optical system including an illumination area forming optical system for forming an illumination area on the mask, a step of exposing a photosensitive substrate by using a projection optical system for projecting a pattern image of the mask onto the photosensitive substrate, and a step of adjusting the illumination optical system; the method satisfying an expression of $0.01<NA1/(NA2\times\beta)<6$, where NA1 is the maximum numerical aperture of the illumination area forming optical system on a light source side, is the imaging magnification of the illumination area forming optical system, and NA2 is the maximum numerical aperture of the projection optical system on the photosensitive substrate side.

In still another aspect, the present invention provides a method of manufacturing an exposure apparatus, comprising an illumination optical system for illuminating a mask having a transfer pattern with illumination light, and a projection optical system for projecting a transfer pattern image of the mask onto a photosensitive substrate, for exposing the transfer pattern of the mask onto the photosensitive substrate in an overlapping manner so as to expose a pattern larger than the transfer pattern on the mask onto the photosensitive substrate; the method comprising an aberration correcting step of correcting a rotationally asymmetrical aberration or decentering aberration remaining in the illumination optical system, and an adjusting step of adjusting an optical characteristic deteriorated by the aberration correcting step.

In still another aspect, the present invention provides a method of manufacturing an exposure apparatus, comprising an illumination optical system for illuminating a mask having a transfer pattern with illumination light, and a projection optical system for projecting a transfer pattern image of the mask onto a photosensitive substrate, for exposing the transfer pattern of the mask onto the photosensitive substrate; the method comprising an aberration correcting step of correcting a rotationally asymmetrical aberration or decentering aberration remaining in the illumination optical system, and an adjusting step of adjusting an optical characteristic deteriorated by the aberration correcting step; the method satisfying an expression of $0.01<NA1/(NA2\times\beta)<6$, where NA1 is the maximum numerical aperture of an imaging optical system included in the illumination optical system on a side opposite from the mask side, $\beta$ is the absolute value of imaging magnification of the imaging optical system, and NA2 is the maximum numerical aperture of the projection optical system on the photosensitive substrate side.

In still another aspect, the present invention provides a method of manufacturing an exposure apparatus comprising an illumination optical system for illuminating a mask having a transfer pattern with illumination light, and a projection optical system for projecting a transfer pattern image of the mask onto a photosensitive substrate; the method comprising a measuring step of measuring an optical characteristic in an illumination area formed on the mask or an exposure area formed on the photosensitive substrate, a first aberration correcting step of correcting a rotationally symmetrical aberration remaining in the illumination optical system according to a result of measurement obtained by the measuring step, and a second aberration correcting step of correcting a rotationally asymmetrical aberration remaining in the illumination optical system according to a result of measurement obtained by the measuring step.

In still another aspect, the present invention provides a method of manufacturing an exposure apparatus for exposing a pattern formed in a mask onto a photosensitive substrate; the method comprising the steps of installing an illumination optical system including an illumination area forming optical system for forming an illumination area on the mask, installing a projection optical system for projecting a pattern image of the mask onto the photosensitive substrate, measuring an optical characteristic of the illumination optical system, and adjusting the illumination optical system; the method satisfying an expression of $0.01<NA1/(NA2\times\beta)<6$, where NA1 is the maximum numerical aperture of the illumination area forming optical system on the light source side, $\beta$ is the imaging magnification of the illumination area forming optical system, and NA2 is the maximum numerical aperture of the projection optical system on the photosensitive substrate side.

BRIEF DESCRIPTION OF THE DRAWINGS

FIG. 6A is a chart showing spherical aberration in the blind imaging optical system in the embodiment of the present invention;

FIG. 6B is a chart showing astigmatism in the blind imaging optical system in the embodiment of the present invention;

FIG. 6C is a chart showing distortion in the blind imaging optical system in the embodiment of the present invention;

FIG. 6D is a chart showing lateral aberration (coma) in the blind imaging optical system in the embodiment of the present invention;

FIG. 9A is a chart showing spherical aberration in the first configurational example of the projection optical system PL in accordance with the embodiment of the present invention;

FIG. 9B is a chart showing astigmatism in the first configurational example of the projection optical system PL in accordance with the embodiment of the present invention;

FIG. 9C is a chart showing distortion in the first configurational example of the projection optical system PL in accordance with the embodiment of the present invention;

FIG. 9D is a chart showing lateral aberration in the first configurational example of the projection optical system PL in accordance with the embodiment of the present invention;

DESCRIPTION OF THE PREFERRED EMBODIMENTS

Figure 1:
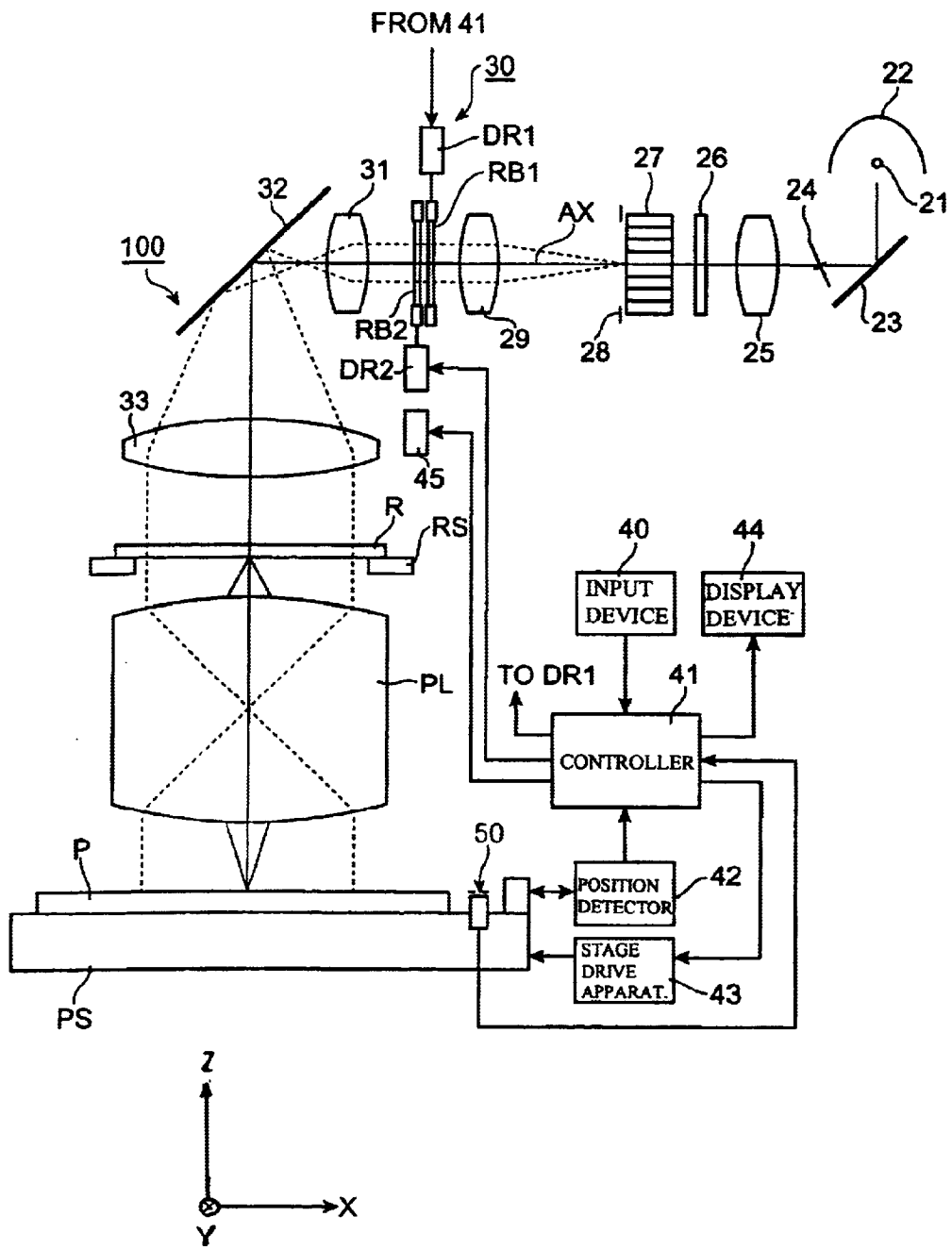
FIG. 1 is a view schematically showing the configuration of the exposure apparatus in accordance with an embodiment of the present invention.

In the present invention, an exposure apparatus for exposing a transfer pattern of a mask onto a photosensitive substrate in an overlapping manner is equipped with an adjusting unit for adjusting an optical characteristic on the mask or on the photosensitive substrate. Specifically, the adjusting unit moves an illumination area defining unit and a part of optical members (lenses and the like) in an imaging optical system along the optical axis, shifts them within a plane orthogonal to the optical axis, tilts them with respect to the optical axis, rotates them about the optical axis, and so forth, so as to correct (adjust) optical characteristics (aberration, magnification, and focus) of the imaging optical system, for example. Here, the illumination area defining unit is disposed at a position substantially optically conjugate with the mask and defines a predetermined area corresponding to the illumination area to be formed on the mask. The imaging optical system projects the predetermined area defined by the illumination area defining unit onto the mask, so as to form the illumination area on the mask.

As optical characteristics of the imaging optical system are adjusted, other optical characteristics may deteriorate. Specifically, when the optical members are moved and so forth in order to correct aberrations of the imaging optical system as mentioned above, the uniformity in illuminance on the mask or photosensitive substrate and the telecentricity on the mask or photosensitive substrate may deteriorate. Therefore, the adjusting unit moves a first lens or first lens group constituting the imaging optical system and so forth in order to adjust optical characteristics of the imaging optical system, for example, and also moves a second lens or second lens group constituting the imaging optical system and so forth in order to correct the optical characteristics deteriorating due to the adjustment.

Thus, even when an aberration substantially remains in the imaging optical system in a state incorporated in the exposure apparatus, the imaging optical system for forming an image of the opening of the illumination area defining unit (field stop) or the like onto the mask or the illumination area defining unit itself is optically adjusted in accordance with the present invention, whereby optical characteristics of the imaging optical system and, consequently, optical characteristics of the exposure optical system including the illumination optical system can finally be adjusted. As a result, the image of the opening of the illumination area defining unit or the like can be formed substantially faithfully on the mask. Specifically, the linearity and directivity (no inclination with respect to the horizontal or vertical direction) of images of opening edges as to the illumination are defining unit on the mask are secured, so that the width of overlapping exposure parts becomes uniform, whereby the amount of exposure in the overlapping exposure parts becomes uniform as well.

As in the foregoing, the exposure apparatus of the present invention can prevent the amount of exposure in overlapping exposure parts from becoming uneven due to aberrations and fluctuations in magnification of the imaging optical system defining the illumination area on the mask, for example, thereby being able to carry out favorable overlapping exposure in which the amount of exposure in overlapping exposure parts and the amount of exposure in non-overlapping exposure parts are substantially equal to each other. Namely, the imaging optical system is configured such that Seidel's five aberrations, wavefront aberrations, and aberrations occurring due to eccentricity are adjustable therein, so as to improve imaging performances thereof, whereby aberrations are favorably corrected within the illumination field of view formed on the mask or photosensitive substrate, accordingly it is possible to carry out favorable overlapping exposure. In the method of manufacturing an exposure apparatus in accordance with the present invention, aberrations and fluctuations in magnification of the imaging optical system incorporated in the exposure apparatus are adjusted favorably, whereby it is possible to realize an exposure apparatus which can carry out favorable exposure in which the amount of exposure in overlapping exposure parts and that in non-overlapping exposure parts substantially equal each other. When a mask is illuminated with the exposure apparatus of the present invention such that images of a transfer pattern of the mask are exposed to the photosensitive substrate in an overlapping manner, a favorable microdevice having a large area can be obtained.

An embodiment of the present invention will be explained with reference to the accompanying drawings. FIG. 1 is a view schematically showing the configuration of the exposure apparatus in accordance with the embodiment of the present invention. In this embodiment, the present invention is applied to a projection exposure apparatus used for manufacturing a liquid crystal display substrate, i.e., a projection exposure apparatus for projecting a transfer pattern on a mask (hereinafter referred to as "reticle") onto a photosensitive substrate (hereinafter referred to as "plate") coated with a resist under a predetermined magnification. Though this embodiment relates to an exposure apparatus for carrying out overlapping exposure, the present invention is not restricted thereto and is applicable to exposure operations without overlapping exposure, such as normal projection exposure operations under a reduction magnification, for example.

In FIG. 1, Z axis is set parallel to the optical axis AX of a projection optical system PL, X axis is set parallel to the paper surface of FIG. 1 within a plane perpendicular to the optical axis AX, and Y axis is set perpendicular to the paper surface of FIG. 1 within the plane perpendicular to the optical axis AX.

The exposure apparatus shown in FIG. 1 comprises a light source 21 made of an extra-high pressure mercury lamp, for example. Also usable as the light source 21 is a laser light source such as a KrF excimer laser light source at a wavelength of 248 nm, ArF excimer laser light source at a wavelength of 193 nm, or the like. The light source 21 is positioned at a first focal position of an ellipsoidal mirror 22 having a reflecting surface made of an ellipsoidal surface of revolution. Consequently, an illumination luminous flux emitted from the light source 21 forms a light source image at a second focal position of the ellipsoidal mirror 22 by way of a reflecting mirror 23 (plane mirror). A shutter 24 is disposed at the second focal position.

A divergent luminous flux from the light source image formed at the second focal position of the ellipsoidal mirror 22 is turned into a substantially parallel luminous flux by a collector lens 25, and then is made incident on a wavelength-selective filter 26 which transmits therethrough luminous fluxes in a desirable wavelength range alone. In the wavelength-selective filter 26, only light at i-line (365 nm), for example, is selected as exposure light. Thus selected light is made incident on a flyeye integrator (optical integrator) 27. For example, the wavelength-selective filter 26 may select g-line (436 nm) and h-line (405 nm) of light at the same time, or g-line, h-line, and i-line of light at the same time.

The flyeye integrator 27 is constituted by a number of positive lens elements which are densely arranged in a matrix such that their center axes extend along the optical axis AX. Therefore, the luminous flux incident on the flyeye integrator 27 is wavefront-divided by a number of lens elements, so as to form a secondary light source composed of light source images whose number is identical to the number of lens elements at the image-side focal plane of the flyeye integrator (i.e., in the vicinity of the exit surface). Namely, a substantially planar light source is formed at the image-side focal plane of the flyeye integrator 27.

The luminous flux from the secondary light source is restricted by an aperture stop 28 disposed near the image-side focal plane of the flyeye integrator 27 and then is made incident on a first relay lens (first relay optical system) 29. The aperture stop 28 is disposed at a position substantially optically conjugate with an entrance pupil surface of the projection optical system PL which will be explained later, and has a variable opening for defining the range of secondary light source contributing to illumination. By changing the aperture size of the variable opening, the aperture stop 28 sets the σ value (the ratio of the diameter of the light source image on the pupil surface of the projection optical system PL to the aperture size of the pupil surface) for determining illumination conditions to a desirable value.

The luminous flux collected by way of the first relay lens 29 is made incident on a reticle blind apparatus 30 for defining the illumination area (illumination field of view) of the reticle R. The reticle blind apparatus 30 as an illumination area defining unit comprises a variable reticle blind member (variable field stop member) having first and second blind members RB1 and RB2, a first blind driving system DR1 for moving the first blind member RB1 along a plane orthogonal to the optical axis AX, and a second blind driving system DR2 for moving the second blind member RB2 along a plane orthogonal to the optical axis AX.

By way of a blind imaging optical system 100, the luminous flux transmitted through a pair of reticle blinds RB1, RB2 in the reticle blind apparatus 30 illuminates, in an overlapping manner, the reticle R formed with a predetermined transfer pattern. Namely, the luminous flux from the first relay lens 29 uniformly illuminates a pair of reticle blind members RB1, RB2 in a superposing manner, whereby an appropriate illumination area (illumination field of view) is formed on the reticle R. The blind imaging optical system 100 includes a front lens group 31, disposed on the light source side, acting as a first imaging lens; a rear lens group 33, disposed on the reticle side, acting as a second imaging lens; and a reflecting mirror (plane mirror) 32, disposed in an optical path between the front and rear lens groups 31, 33, for folding the optical path.

When changing the size of the illumination area formed on the reticle R by way of the blind imaging optical system 100, a pair of reticle blind members RB1, RB2 are driven by a pair of blind driving systems DR1, DR2, respectively, when necessary. The driving of a pair of blind driving systems DR1, DR2 is controlled by a controller 41 according to input information (process information or the like) to change the illumination area in the reticle R or plate P fed to the controller 41 by way of an input device 40.

By way of the projection optical system PL, the luminous flux transmitted through the reticle R reaches a plate P which is a photosensitive substrate. An image of the transfer pattern of the reticle R is thus formed in a unit exposure area on the plate P. Here, the reticle R on which a predetermined pattern such as a circuit pattern is drawn is mounted on a reticle stage RS. The plate P is mounted on a plate stage PS which is two-dimensionally movable within a plane (XY plane) perpendicular to the optical axis AX of the projection optical system PL. Since the aperture stop 28 disposed at the image-side focal plane of the flyeye integrator 27 and the entrance pupil surface of the projection optical system PL are disposed substantially conjugate with each other as mentioned above, an image of the secondary light source restricted by the aperture stop 28 (an image of the opening of the aperture stop 28) is formed on the entrance pupil surface of the projection optical system PL, whereby the reticle R and the plate P are subjected to so-called Koehler illumination.

Also, the exposure apparatus of FIG. 1 is provided with a position detector (interferometer or the like) 42 for detecting the position of the plate stage PS (e.g., in three directions of X-, Y-, and Z-directions). The positional signal from the position detector 42 is supplied to the controller 41. According to the positional signal from the position detector 42, the controller 41 controls a stage driving apparatus 43 for moving the plate stage PS. As a consequence, the position of the plate stage PS in each direction (e.g., each of three directions of X-, Y-, and Z-directions) is controlled. Therefore, as exposure is sequentially carried out while the plate stage PS and, consequently, the plate P are moved two-dimensionally, the pattern of reticle R is successively transferred to individual unit exposure areas of the plate P.

One end of the plate stage PS for holding the plate P is provided with a photoelectric detector 50 for measuring optical characteristics (aberrations and illumination characteristics) of an exposure optical system including both of an illumination optical system (21 to 33) and the projection optical system PL, the illumination optical system (21 to 33), or the blind imaging optical system 100. Detection signals from the photoelectric detector 50 are supplied to the controller 41. Results of measurement in the photoelectric detector 50 are displayed by a display device 44 electrically connected to the controller 41.

Here, the photoelectric detector 50 is constituted by a photoelectric sensor having a minute pinhole, a light-receiving sensor comprising an enlarging optical system and a CCD, or the like, for example. As a consequence, various aberrations, illuminance distributions, and the like as optical characteristics of the exposure optical system (21 to 33, PL), illumination optical system (21 to 33), or blind imaging optical system 100 can be detected photoelectrically. As the plate stage PS shown in FIG. 1 is moved two-dimensionally, the photoelectric detector 50 detects two-dimensional optical characteristics (illumination characteristics) along the image surface of the projection optical system PL.

As will be explained later, the blind imaging optical system 100 is configured such that a plurality of lenses are movable along the optical axis AX, shiftable (i.e., movable) along a plane orthogonal to the optical axis AX, or tiltable with respect to the optical axis AX, or rotatable about the optical axis AX when necessary. According to a result of measurement obtained by the photoelectric detector 50, the controller 41 outputs a control signal, whereas the movements (including shifting and tilting) and rotations of these lenses are driven by a lens driving device 45 which is an example of the adjusting unit. As a consequence, optical performances of the illumination optical system are adjusted favorably. In this case, the illumination optical system and projection optical system preferably satisfy conditional expression (1) which will be explained later.

Figure 2:
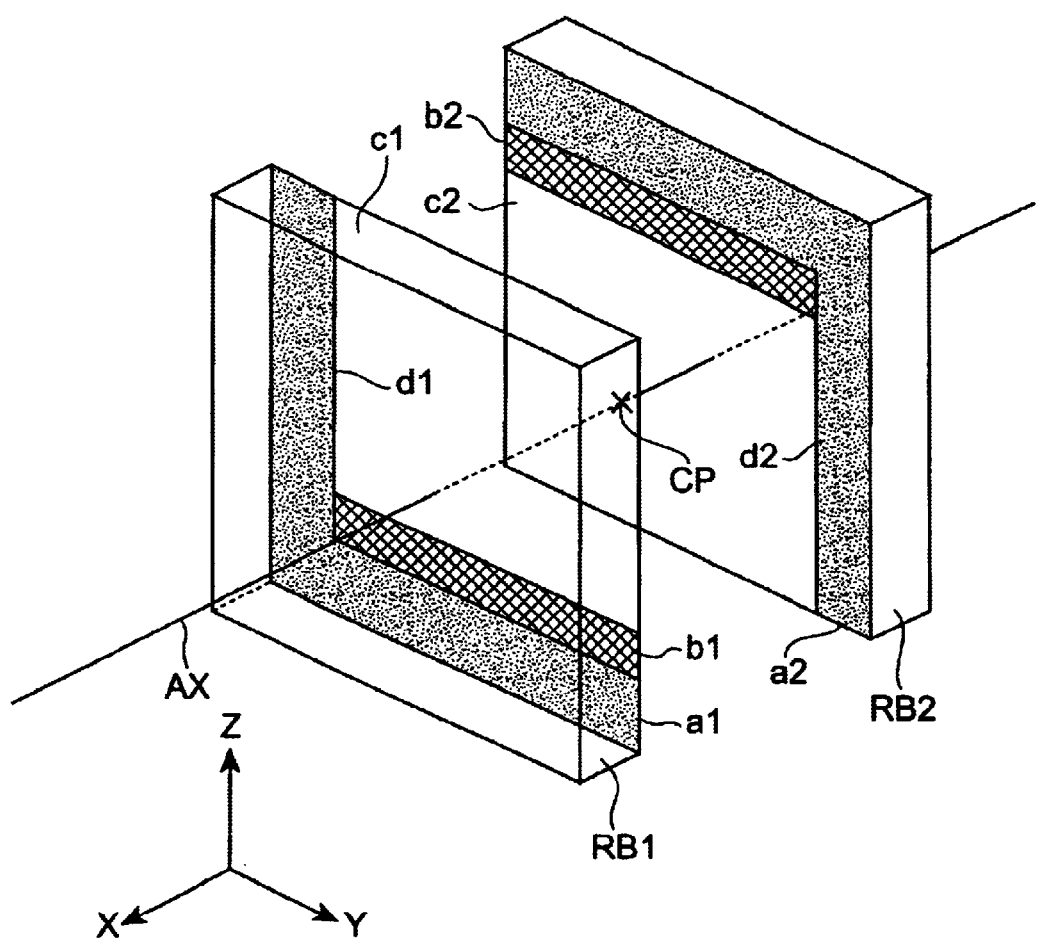
FIG. 2 is an enlarged perspective view showing the configuration of a major part of a reticle blind apparatus provided in the exposure apparatus in accordance with the embodiment of the present invention.

FIG. 2 is an enlarged perspective view showing the configuration of a major part of the reticle blind apparatus 30 of FIG. 1, illustrating a pair of reticle blind members RB1, RB2 constituting the reticle blind apparatus 30 as seen from the light source side along the optical axis AX. As shown in FIG. 2, the reticle blind apparatus 30 comprises the first and second blind members RB1, RB2, each made of a transparent glass substrate formed like a plate parallel to the YZ plane. The first and second blind members RB1, RB2 are orthogonal to the optical axis AX. The intersection between a plane orthogonal to the pattern surface of the reticle R and the optical axis AX is referred to as CP. The distance between the first blind member RB1 and the intersection CP is identical to that between the second blind member RB2 and the intersection CP. Specifically, a gap of several hundreds of micrometers is secured between a pair of reticle blind members RB1, RB2 in order to drive each of the reticle blind members RB1, RB2 mechanically.

The surface of first blind member RB1 opposing the second blind member RB2 is formed with a light-shielding region a1 and a light-attenuating region b1. The surface of second blind member RB2 opposing the first blind member RB1 is formed with a light-shielding region a2 and a light-attenuating region b2. The light-shielding regions a1, a2 are regions where substantially 100% of the exposure light is kept from transmitting therethrough. The light-attenuating regions b1, b2 are regions having a predetermined transmissivity distribution along the Z direction with respect to the exposure light. The regions (whitened in FIG. 2) of surfaces of reticle blind members RB1, RB2 facing each other formed with neither light-shielding regions nor light-attenuating regions are light-transmitting regions c1, c2, respectively. The light-transmitting regions c1, c2 transmit substantially 100% of exposure light therethrough.

In the first blind member RB1, the light-transmitting region c1 is formed like a rectangle extending along Y- and Z-directions, whereas the light-shielding region a1 comprises respective rectangular portions extending along Z- and Y-directions, thus being shaped like an L as a whole. Here, the light-shielding region a1 is formed on the −Z and −Y direction sides of the light-transmitting region c1. Formed between the light-transmitting region c1 and the rectangular portion of light-shielding region a1 extending along the Y direction is the rectangular light-attenuating region b1 extending along the Y direction. The boundary line between the light-transmitting region c1 and the rectangular portion of light-shielding region a1 extending along the Z direction constitutes an edge pattern d1 extending along the Z direction. The second blind member RB2 has substantially the same configuration as that of the first blind member RB1 but differs therefrom in that the light-shielding region a2 is formed on the +Z and +Y direction sides of the light-transmitting region c2.

Figure 3:
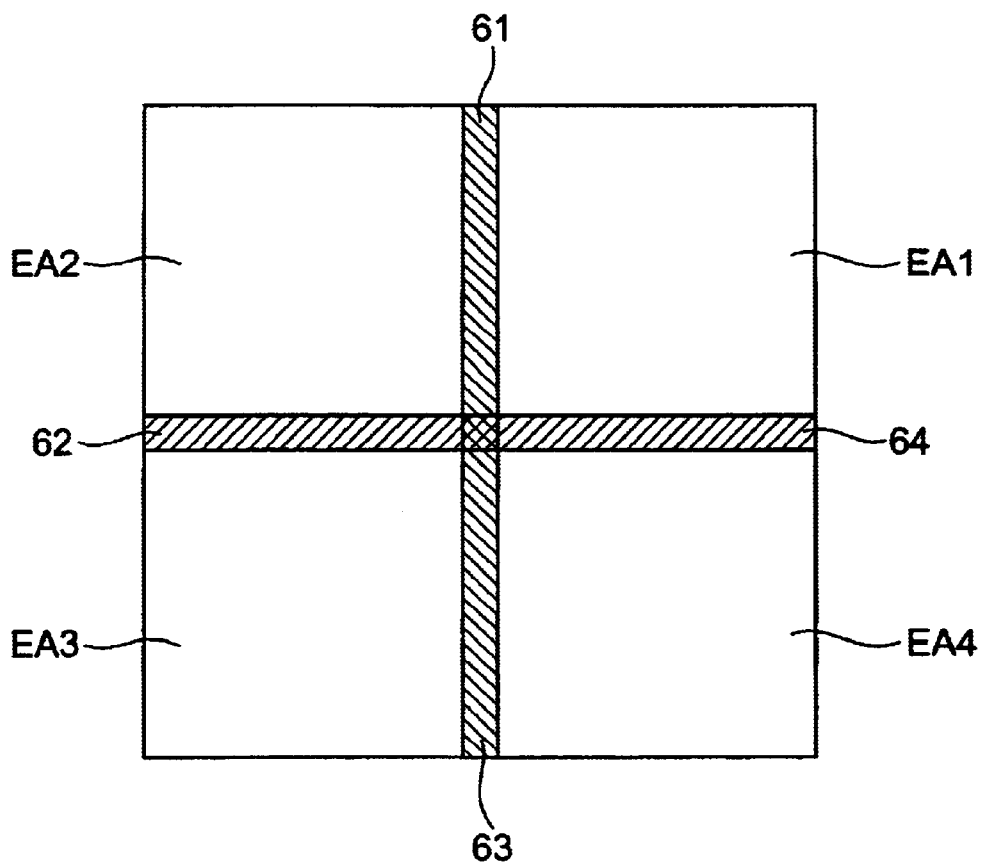
FIG. 3 is a view showing the arrangement and overlap of four unit exposure areas EA1 to EA4 on a plate P when four reticle patterns are screen-synthesized in the embodiment of the present invention.
Figure 4:
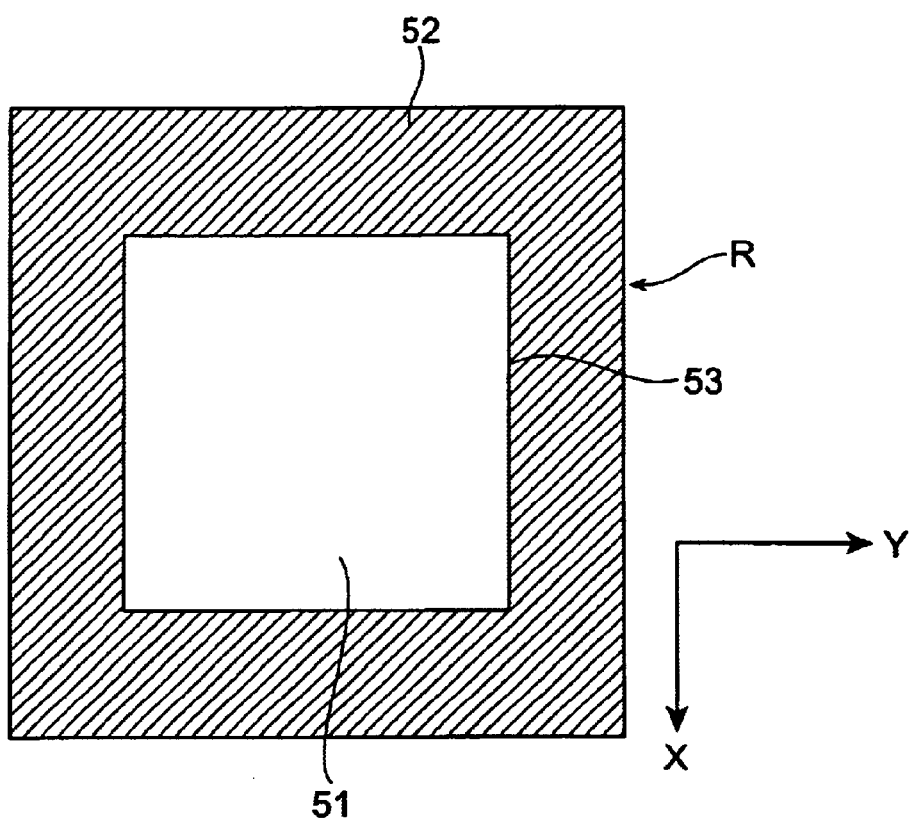
FIG. 4 is a plan view showing the configuration of a pattern surface of a reticle R employable in the exposure apparatus in accordance with the embodiment of the present invention.

FIG. 3 is a view showing the arrangement and overlap of four unit exposure areas EA1 to EA4 on the plate P when four reticle patterns are screen-synthesized. FIG. 4 is a plan view showing the configuration of the pattern surface of reticle R. As shown in FIG. 4, the pattern surface of reticle R is formed with a rectangular pattern area 51 on which a transfer pattern is drawn, and a light-shielding zone 52 surrounding the rectangular pattern area 51. A chromium film, for example, is deposited on the light-shielding zone 52 so as to block the transmission of exposure light by substantially 100%. Formed between the pattern area 51 and the light-shielding zone 52 is a rectangular light-shielding zone edge 53.

In the following, with reference to FIGS. 3 and 4, exposure operations which are carried out successively in the order of the first, second, third, and fourth unit exposure areas EA1, EA2, EA3, and EA4 will be explained in brief. First, for exposure to the first unit exposure area EA1, a first reticle R1 formed with a first exposure pattern to form the first unit exposure area EA1 is set on the reticle stage RS by a reticle exchanging apparatus (not depicted).

In the initial state of exposure to the first unit exposure area EA1, the light-attenuating region b1 and edge pattern d1 of the first blind member RB1 overlap the pattern area 51 of the first reticle R1, whereas the light-attenuating region b2 and edge pattern d2 of the second blind member RB2 overlap the light-shielding zone 52 of the first reticle R1. For exposure to the first unit exposure area EA1, the first and second blind driving systems DR1, DR2 drive the first and second blind members RB1, RB2 in −Y and +Y directions, respectively, at a constant speed. Thus, the exposure to the first unit exposure area EA1 on the plate P1, which is a photosensitive substrate, is carried out.

Subsequently, the reticle exchanging apparatus takes the first reticle R1 out of the reticle stage RS. Thereafter, for exposure to the second unit exposure area EA2, a second reticle R2 formed with a second exposure pattern to form the second unit exposure area EA2 is set on the reticle stage RS by the reticle exchanging apparatus. Simultaneously with this reticle exchanging operation, the plate stage PS and, consequently, the plate P are moved by way of the stage driving apparatus 43, and then the exposure to the second unit exposure region EA2 is carried out.

In the initial state of exposure to the second unit exposure area EA2, the light-attenuating region b1 of the first blind member RB1 and the edge pattern d2 of the second blind member RB2 overlap the pattern area 51 of the second reticle R2, whereas the light-attenuating region b2 of the second blind member RB2 and the edge pattern d1 of the first blind member RB1 overlap the light-shielding zone 52 of the second reticle R2. Then, the first and second blind driving systems DR1, DR2 drive the first and second blind members RB1, RB2 in −Y and +Y directions, respectively, at a constant speed. Here, the moving distance of a pair of reticle blind members RB1, RB2 upon exposure is the same as that in the exposure to the first unit exposure area EA1.

Subsequently, the reticle exchanging apparatus takes the second reticle R2 out of the reticle stage RS. Thereafter, for exposure to the third unit exposure area EA3, a third reticle R3 formed with a third exposure pattern to form the third unit exposure area EA3 is set on the reticle stage RS by the reticle exchanging apparatus. Simultaneously with this reticle exchanging operation, the plate stage PS and, consequently, the plate P are moved by way of the stage driving apparatus 43, and then the exposure to the third unit exposure region EA3 is carried out.

In the initial state of exposure to the third unit exposure area EA3, the light-attenuating region b2 and edge pattern d2 of the second blind member RB2 overlap the pattern area 51 of the third reticle R3, whereas the light-attenuating region b1 and edge pattern d1 of the first blind member RB1 overlap the light-shielding zone 52 of the third reticle R3. Then, the first and second blind driving systems DR1, DR2 drive the first and second blind members RB1, RB2 in −Y and +Y directions, respectively, at a constant speed. Here, the moving distance of a pair of reticle blind members RB1, RB2 upon exposure is the same as that in the exposure to the first and second unit exposure areas EA1 and EA2.

Finally, the reticle exchanging apparatus takes the third reticle R3 out of the reticle stage RS. Thereafter, for exposure to the fourth unit exposure area EA4, a fourth reticle R4 formed with a fourth exposure pattern to form the fourth unit exposure area EA4 is set on the reticle stage RS by the reticle exchanging apparatus. Simultaneously with this reticle exchanging operation, the plate P is further moved by way of the stage driving apparatus 43, and then the exposure to the fourth unit exposure region EA4 is carried out.

In the initial state of exposure to the fourth unit exposure area EA4, the light-attenuating region b2 of the second blind member RB2 and the edge pattern d1 of the first blind member RB1 overlap the pattern area 51 of the fourth reticle R4, whereas the light-attenuating region b1 of the first blind member RB1 and the edge pattern d2 of the second blind member RB2 overlap the light-shielding zone 52 of the fourth reticle R4. Then, the first and second blind driving systems DR1, DR2 drive the first and second blind members RB1, RB2 in −Y and +Y directions, respectively, at a constant speed. Here, the moving distance of a pair of reticle blind members RB1, RB2 upon exposure is the same as that in the exposure to the first to third unit exposure areas EA1 to EA3.

As exposure operations are thus successively carried out while the plate P is moved two-dimensionally, a substantially constant quantity of exposure light can be obtained in the four unit exposure areas EA1 to EA4 on the plate P. Namely, substantially the same quantity of exposure light can be obtained in the overlapping exposure areas (hatched areas in FIG. 3) 61 to 64 and the remaining non-overlapping exposure areas (whitened in FIG. 3). For other details of overlapping exposure, U.S. Pat. No. 5,486,896 is incorporated herein by reference.

In the foregoing explanation, overlapping exposure of so-called step-and-repeat type, in which the pattern of each reticle R is exposed to each unit exposure area on the respective plate P as a whole, is carried out. However, without being restricted thereto, overlapping exposure of so-called step-and-scan type, in which each reticle pattern is scanned and exposed to individual unit exposure areas on the plate P while each reticle R and the plate P are relatively moved with respect to the projection optical system, can also be carried out. Though four different reticles are used for carrying out overlapping exposure in the foregoing explanation, it is not restrictive, and a single large reticle formed with four unit exposure patterns may be used for carrying out overlapping exposure while moving the reticle R and plate P stepwise.

Figure 5:
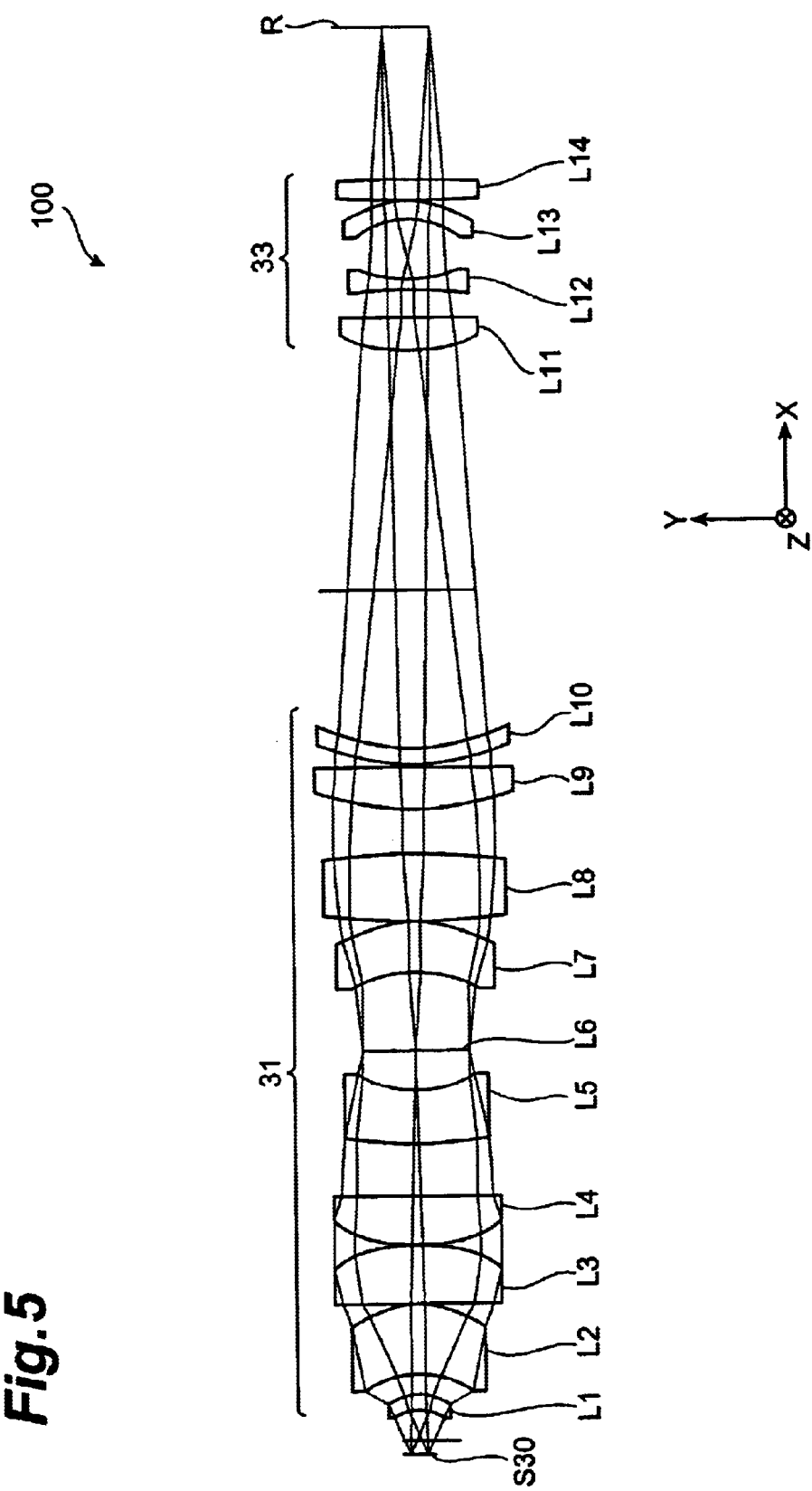
FIG. 5 is a view showing the lens configuration of a blind imaging optical system disposed in an optical path between a pair of reticle blind members RB1, RB2 and the reticle R in the embodiment of the present invention.

FIG. 5 is a view showing the lens configuration of the blind imaging optical system 100 disposed in the optical path between a pair of reticle blind members RB1, RB2 and the reticle R. The blind imaging optical system 100 in this embodiment is an optical system which is telecentric on both sides with an imaging magnification of −4.4× obtained by optimizing radii of curvature and the like according to lens data of the optical system disclosed in Japanese Patent Application Laid-Open No. HEI 9-197270.

FIG. 5 shows the lens configuration of the blind imaging optical system 100 expanded along the optical axis AX without depicting the reflecting mirror (plane mirror) 32 disposed between the front lens group 31 and rear lens group 33. In FIG. 5, x axis of local coordinates is set parallel to the optical axis AX of the blind imaging optical system 100, y axis of the local coordinates is set parallel to the paper surface of FIG. 1 within a plane perpendicular to the optical axis AX, and z axis of the local coordinates is set perpendicular to the paper surface of FIG. 1 within the plane perpendicular to the optical axis AX.

In the blind imaging optical system 100 of FIG. 5, the front lens group 31 comprises, successively from the reticle blind side, i.e., object side, a positive meniscus lens L1 having a concave surface directed onto the object side, a negative meniscus lens L2 having a concave surface directed onto the object side, a positive meniscus lens L3 having a concave surface directed onto the object side, a positive meniscus lens L4 having a convex surface directed onto the object side, a negative meniscus lens L5 having a convex surface directed onto the object side, a plane parallel plate L6, a negative meniscus lens L7 having a concave surface directed onto the object side, a biconvex lens L8, a positive meniscus lens L9 having a convex surface directed onto the object side, and a negative meniscus lens L10 having a convex surface directed onto the object side.

The rear lens group 33 comprises, successively from the object side, a positive meniscus lens L11 having a convex surface directed onto the object side, a biconcave lens L12, a negative meniscus lens L13 having a concave surface directed onto the object side, and a biconvex lens L14. In FIG. 5, the object surface S30 is a surface optically conjugate with the pattern forming surface of the reticle R and orthogonal to the optical axis AX while including the intersection CP (see FIG. 2).

The following Table 1 shows values of various items of the blind imaging optical system 100 in accordance with this embodiment. In "Main Items" in Table 1, NA1 indicates the maximum numerical aperture of the blind imaging optical system 100 on the object side (reticle blind side), whereas β indicates the absolute value of imaging magnification of the blind imaging optical system 100. In "Lens Items" in Table 1, the surface number in the first column indicates the number of each surface counted from the object surface, letter r in the second column indicates the radius of curvature (mm) of each surface, letter d in the third column indicates the axial space, i.e., surface separation (mm), between each pair of neighboring surfaces, and letter n in the fourth column indicates the refractive index with respect to KrF excimer laser light (λ=248.38 nm). In this embodiment, all the optical members constituting the blind imaging optical system 100 are formed from silica materials having the same refractive index.

TABLE 1

{Main Items}

NA 1 = 0.6
β = 4.44

{Lens Items}

| Surface number | r | d | n | |
|---|---|---|---|---|
| | (S30) | 30.72 | | |
| 1 | −68.55 | 13.81 | 1.50834 | (lensL1) |
| 2 | −40.75 | 18.11 | | |
| 3 | −39.48 | 55 | 1.50834 | (lensL2) |
| 4 | −75.55 | 1 | | |
| 5 | −1988.70 | 43.85 | 1.50834 | (lensL3) |
| 6 | −150.26 | 2 | | |
| 7 | 160.42 | 38.48 | 1.50834 | (lensL4) |
| 8 | 2663.74 | 43.07 | | |
| 9 | 228.98 | 45 | 1.50834 | (lensL5) |
| 10 | 115.51 | 28.67 | | |
| 11 | ∞ | 1.5 | 1.50834 | (planeparallelplateL6) |
| 12 | ∞ | 69.45 | | |
| 13 | −78.85 | 37.23 | 1.50834 | (lensL7) |
| 14 | −111.96 | 1.06 | | |
| 15 | 508.91 | 55.65 | 1.50834 | (lensL8) |
| 16 | −890.32 | 36.53 | | |
| 17 | 196.40 | 35 | 1.50834 | (lensL9) |
| 18 | 2086.20 | 2.57 | | |
| 19 | 149.03 | 12.67 | 1.50834 | (lensL10) |
| 20 | 117.09 | 327.91 | | |
| 21 | 85.54 | 27.87 | 1.50834 | (lensL11) |
| 22 | 308.07 | 16.73 | | |
| 23 | −245.82 | 8.6 | 1.50834 | (lensL12) |
| 24 | 79.72 | 45 | | |
| 25 | −56.70 | 20 | 1.50834 | (lensL13) |
| 26 | −63.89 | 1.31 | | |
| 27 | 331.68 | 18 | 1.50834 | (lensL14) |
| 28 | −313.87 | 114.39 | | |
| | (reticleR) | | | |

FIGS. 6A to 6D are aberration charts of the blind imaging optical system 100 of this embodiment when the numerical aperture NA on the reticle side is 0.10 while the maximum image height Y is 40 mm. FIGS. 6A to 6D show spherical aberration, astigmatism, distortion, and lateral aberration (coma), respectively. In the astigmatism chart and lateral aberration chart, solid and broken lines indicate sagittal and meridional image surfaces, respectively. As can be seen from each aberration chart, the blind imaging optical system 100 has favorable performances in terms of design.

When manufacturing the illumination optical system and the projection optical system PL as well as the blind imaging optical system (blind relay optical system) 100, processing errors of lenses constituting the individual optical systems and assembling errors of the individual optical systems may accumulate, whereby the state of aberrations may fluctuate greatly. Namely, even when the aberrations of optical systems are favorably corrected in terms of design, actual aberrations of the optical systems are not always favorable in the state mounted in the exposure apparatus under the influence of accumulated errors.

Initially, a case where an assembling error occurs in an optical system is considered. In general, decentering aberrations such as decentering distortion, image surface tilting, image surface deviation, and decentering coma, for example, may occur when a lens is decentered upon assembling the optical system. Here, the amount of decentering aberration generated varies while being determined by the aberration coefficient inherent in each lens.

Hence, lenses are decentered in the blind imaging optical system 100 so as to generate image surface tilting and decentering distortion. Specifically, when four lenses L11 to L14 constituting the rear lens group 33 in the blind imaging optical system 100 are integrally shifted by +2 mm along the y direction, an image surface in the meridional direction (y direction in FIG. 5) defined by coordinates (y, z)=(30, 0), (0, 0), (−30, 0) shifts along the x direction by −1.00 mm, −0.05 mm, and 0.88 mm at these points, respectively, whereby the image surface inclines by a width of about 2 mm (1.00+ 0.88). At this time, except for the center shift, the amount of occurrence of decentering distortion is small, i.e., about 8 μm, at four corners and the midpoint of each side of the 30-mm square image surface. In other words, if the lenses L11 to L14 are shifted along a plane orthogonal to the optical axis AX in the blind imaging optical system 100, then the image surface tilting can be corrected (adjusted) while hardly generating decentering distortion.

If the lens L11 in the blind imaging optical system 100 is shifted alone by +2 mm along the y direction, then the amount of occurrence of decentering distortion at four corners of the 30-mm square image surface is large, i.e., about 220 μm, except for the center shift. At this time, the image surface in the meridional direction (y direction in FIG. 5) defined by coordinates (y, z)=(30, 0), (0, 0), (−30, 0) shifts along the x direction by 0.18 mm, 0 mm, and −0.23 mm at these points, respectively, whereby the inclination of image surfaces is very small. In other words, if the lens 11 in the blind imaging optical system 100 is shifted alone along a plane orthogonal to the optical axis AX, then decentering distortion can be corrected (adjusted) while hardly generating image surface tilting.

If one or a plurality of lenses in the blind imaging optical system 100 are decentered as in the foregoing, then decentering aberrations such as decentering distortion and image surface tilting occurring due to assembling errors and the like can be corrected favorably. Here, a shift mechanism for shifting (decentering) lenses along a plane orthogonal to the optical axis AX may be a mechanism for shifting the lenses in one decentering direction by using a set screw/turnbuckle, or a mechanism for shifting lenses to any decentering direction so as to be able to correspond to all the decentering directions.

A case where lenses are moved in the optical axis direction in the blind imaging optical system 100 so as to correct the magnification and the rotationally symmetrical distortion with respect to the optical axis and the like will now be explained. First, the lens L14 in the blind imaging optical system 100 is moved along the optical axis AX, whereby the magnification can be changed while hardly generating distortion. By way of example, a case where the lens L14 is moved along the optical axis AX toward the reticle by 3 mm will be considered. Since the focus of the blind imaging optical system 100 also deviates upon the movement of lens L14 in the optical axis direction, the focus is adjusted by integrally moving the lenses L1 to L5 along the optical axis AX toward the reticle by about 0.11 mm. While the magnification of the blind imaging optical system can be changed from −4× to −4.024× as such, distortion changes only about 0.003% at this time.

A case where distortion is changed while hardly changing the magnification will now be explained by way of example. First, the lens L13 in the blind imaging optical system 100 is moved along the optical axis AX away from the reticle R by 8 mm, whereas the lens L14 is moved along the optical axis AX toward the reticle by 1.91 mm in order to correct the change in magnification caused by the movement of lens L13. Also, for correcting the deviation of focus caused by these lens movements, the lenses L1 to L5 are integrally moved along the optical axis AX toward the reticle by about 0.13 mm. Thus, the distortion in the blind imaging optical system 100 can be corrected by about 70 µm at four corners of the 30-mm square image surface, whereas the magnification is maintained substantially constant at this time.

As in the foregoing, one or a plurality of lenses in the lens groups in the blind imaging optical system 100 for forming images of the openings of the reticle blind members RB1, RB2 onto the reticle R are moved in the optical axis direction or moved (shifted) in a direction orthogonal to the optical axis, whereby aberrations such as decentering distortion, image surface tilting, magnification and rotationally symmetrical distortion can be corrected independently of each other.

Though not mentioned in the foregoing explanation, spherical aberration can be corrected if a plane parallel plate is inserted in the optical path between the lens L1 and the reticle blind members RB1, RB2 in the imaging optical system 100 and its thickness is changed. In this case, the plane parallel plate may be constituted by two wedge-shaped prisms which can relatively move the plane parallel plate, and the two wedge-shaped prisms may relatively be moved in directions orthogonal to the optical axis, so that the thickness of the plane parallel plate is made substantially variable. Alternatively, a plurality of plane parallel plates having respective optical thickness values different from each other may be set exchangeable.

In the blind imaging optical system 100, a lens effective against coma may be moved in the optical axis direction, whereas a lens which can substantially solely correct other aberrations, defocusing, fluctuations in magnification, and the like caused upon the lens movement may be moved, whereby coma can substantially be corrected alone. Similarly, a lens effective against decentering coma may be moved in a direction orthogonal to the optical axis, whereas a lens which can substantially solely correct other aberrations, defocusing, fluctuations in magnification, and the like caused upon the lens movement may be moved, whereby decentering coma can substantially be corrected alone. Further, one or a plurality of lenses in the lens groups in the blind imaging optical system 100 maybe moved, shifted, inclined, and so forth, whereby other aberrations such as astigmatism, curvature of field, decentering astigmatic difference, and image surface deviation, for example, can be corrected as well.

When various aberrations of the blind imaging optical system 100 for transferring images of the openings (light-transmitting regions) including the light-attenuating portions (light-attenuating regions) onto the reticle R are thus corrected, the ununiformity in the amount of exposure (accumulated amount of exposure) in overlapping exposure parts can be lowered, whereby it is possible to carryout favorable overlapping exposure in which the amount of exposure (accumulated amount of exposure) in overlapping exposure parts and the amount of exposure (accumulated amount of exposure) in non-overlapping exposure parts are substantially equal to each other.

The foregoing explanation takes account of the adjustment of various aberrations of the blind imaging optical system alone. If the distortion of the blind imaging optical system 100 is corrected (adjusted), then the evenness of illumination in the illumination area on the reticle R or in the exposure area (illumination area) on the plate P is expected to deteriorate (change) as a matter of course. If lenses in the blind imaging optical system 100 are decentered, then the telecentricity on the reticle R or plate P is expected to be lost. Here, the loss of telecentricity means the tilting of the principal ray to be made substantially perpendicularly incident on the reticle R or plate P by way of the blind imaging optical system 100 and projection optical system PL, each of which is an optical system substantially telecentric on both sides. Namely, the deterioration of telecentricity causes the irradiating angle of the center of gravity of the luminous flux onto the reticle R or plate P to substantially deviate from 90 degrees.

In this case, the deterioration in evenness of illumination on the reticle R or plate P upon adjustment of optical characteristics of the blind imaging optical system 100 can be corrected when at least one optical member (lens or the like) constituting the first relay optical system 29 disposed in the optical path between the flyeye integrator 27 and the reticle blind members (RB1, RB2) is moved in the optical axis direction, for example.

The deterioration in telecentricity on the reticle R or plate P upon adjustment of optical characteristics of the blind imaging optical system 100 can be corrected when the flyeye integrator 27 or the collector lens 25 is decentered from the optical axis, i.e., moved in a direction orthogonal to the optical axis. The deterioration in telecentricity on the reticle R or plate P can also be corrected when lenses in the blind imaging optical system 100 are decentered as a matter of course.

By way of example, there is a case where the telecentricity on the reticle R or plate P deteriorates when a part of lenses in the blind imaging optical system 100 is decentered, i.e., moved along a plane orthogonal to the optical axis, so as to correct rotationally asymmetrical distortion (including decentering distortion). In this case, it is preferred that another part of lenses in the blind imaging optical system 100 be moved in the optical axis direction, tilted with respect to the optical axis, or decentered from the optical axis, so as to correct the deterioration in telecentricity.

Here, a pair of prisms having a minute angle of deflection may be inserted in the illumination optical path, and each of the pair of prisms maybe rotated about the optical axis, so as to generate image surface tilting or correct the telecentricity. If characteristics of transfer images of the reticle blind members RB1, RB2 caused by the blind imaging optical system 100 can be corrected upon inserting other optical members into the illumination optical path or deforming optical members in the illumination optical path, it will be effective within the range not deviating from the present invention.

Explained in the foregoing is an example in which lenses having a refracting power is moved in the optical axis direction, inclined with respect to the optical axis, or decentered with respect to the optical axis, so as to adjust optical characteristics on the reticle R or plate P. However, reflection type optical members having an optical power may be moved in the optical axis direction or may be inclined or decentered with respect to the optical axis, so as to adjust optical characteristics on the reticle R or plate P.

Further, the reflecting mirror (plane mirror) 32 as a deflecting member (deflective reflecting member) for reflecting and deflecting the optical path may be moved in the optical axis direction, translated in a direction forming a predetermined angle with respect to the optical axis, or tilted with respect to the optical axis, so as to adjust optical characteristics on the reticle R or plate P. In this case, the reflecting mirror (plane mirror) 32 can be inclined with respect to the optical axis so as to correct the rotationally asymmetrical distortion (trapezoidal distortion).

Here, as the reflecting mirror (plane mirror) 32 inclines with respect to the optical axis, the telecentricity on the reticle R or plate P may deteriorate, and transfer images formed by the blind imaging optical system 100 may rotate or incline (i.e., the illumination surface of the illumination optical system may rotate or incline) on the reticle R. In this case, in order to correct the deterioration in telecentricity, it is preferred that apart of optical members constituting the illumination optical system, such as the flyeye integrator 27 and the like, for example, be moved in the optical axis direction or along a plane orthogonal to the optical axis. On the other hand, in order to correct the rotation or inclination of transfer images formed by the blind imaging optical system 100 on the reticle R, it is preferred that the reticle blind members (RB1, RB2) be rotated about the optical axis or inclined with respect to the optical axis.

Further, for sufficiently correcting optical characteristics (e.g., distortion) on the reticle R or plate P, it is preferred that both steps of correcting rotationally asymmetrical optical characteristics (e.g., rotationally asymmetrical distortion such as trapezoidal/rhomboid distortion) on the reticle R or plate P and correcting rotationally symmetrical optical characteristics (e.g., rotationally symmetrical distortion) on the reticle R or plate P be carried out. In this case, in order to correct rotationally asymmetrical optical characteristics (e.g., rotationally asymmetrical distortion such as trapezoidal/rhomboid distortion) on the reticle R or plate P, it is preferred that a part of optical members in the illumination optical system (e.g., apart of the blind imaging optical system 100) be inclined or decentered with respect to the optical axis.

Also, for correcting rotationally symmetrical optical characteristics (e.g., rotationally symmetrical distortion) on the reticle R or plate P, it is preferred that a part of optical members in the illumination optical system (e.g., a part of the blind imaging optical system 100) be moved along the optical axis direction. Here, as a matter of course, it is more preferable to carry out a step of (moving a part of optical members in the illumination optical system in the optical axis direction, inclining or decentering them with respect to the optical axis, and so forth, for) correcting the deterioration in optical characteristics (e.g., the deterioration of telecentricity or the deterioration of ununiformity in illuminance) occurring when carrying out the foregoing two correcting steps (for rotationally asymmetrical optical characteristics and rotationally symmetrical optical characteristics).

Though it is explained that various kinds of optical characteristics in the blind imaging optical system 100 can be regulated when optical members constituting the blind imaging optical system 100 are adjusted (moved, inclined, and shifted), it is needless to mention that rotationally symmetrical and asymmetrical components in the ununiformity in illumination distribution (fluctuation of illumination) on the mask or substrate can be adjusted by adjusting an appropriate optical member in the blind imaging optical system. In this case, the rotationally asymmetrical component of the ununiformity in illumination distribution (fluctuation of illumination) can be adjusted when optical members constituting the blind imaging optical system 100 are inclined or shifted in a direction orthogonal to the optical axis, whereas the rotationally symmetrical component of the ununiformity in illumination distribution (fluctuation of illumination) can be adjusted when optical members constituting the blind imaging optical system 100 are moved along the optical axis.

The adjustment of individual optical members constituting the blind imaging optical system 100 and illumination optical system explained in the foregoing may be performed manually by an operator via an adjusting mechanism (e.g., the above-mentioned shift mechanism) for mechanically adjusting (moving, inclining, or decentering) each optical member according to results of measurement photoelectrically detected by the photoelectric detector 50. Further, according to results of measurement photoelectrically detected by the photoelectric detector 50, the amount of adjustment of each optical member constituting the illumination optical system may be calculated by the controller 41, so that each optical member is automatically adjusted by way of an adjusting mechanism including the lens driving device 45 or the like. In this case, for further favorably adjusting optical performances of the blind imaging optical system and illumination optical system, it is preferred that the illumination optical system and projection optical system satisfy conditional expression (1) which will be explained later.

Figure 7:
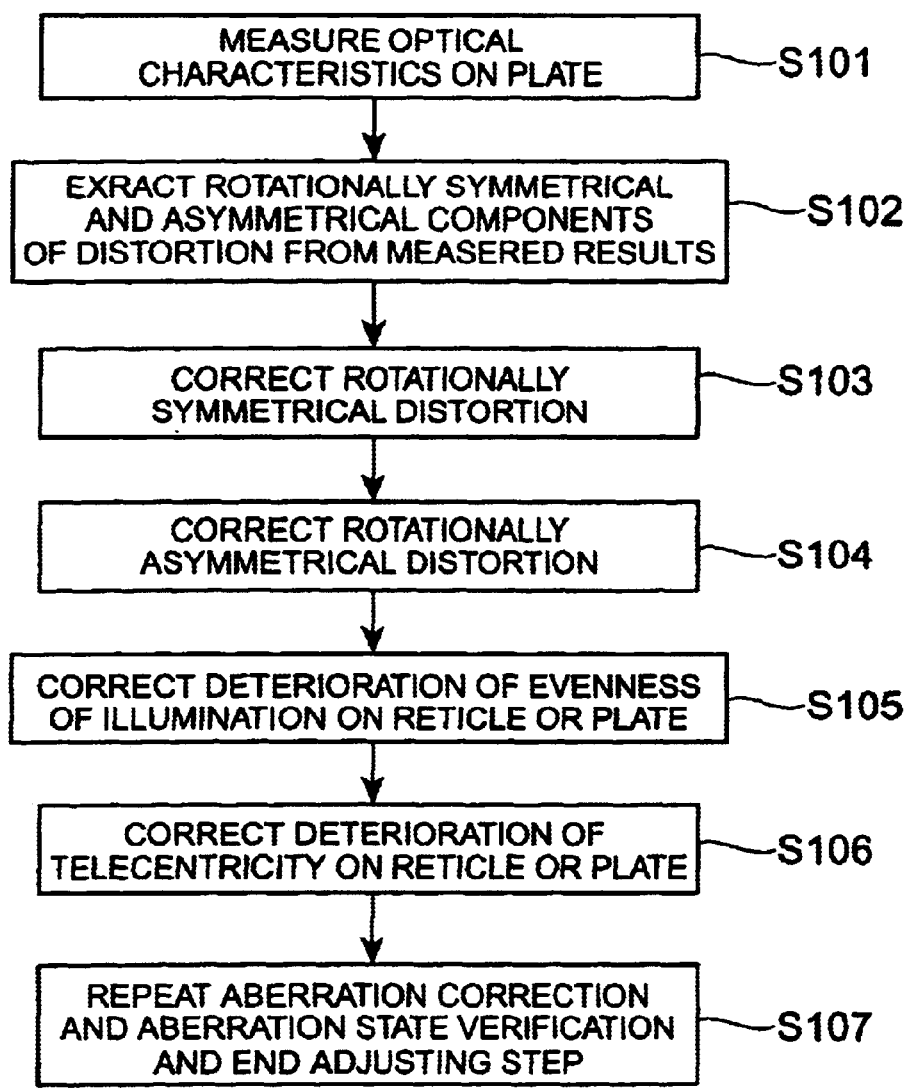
FIG. 7 is a flowchart for explaining an adjusting step (a measuring step, a correcting step, and the like) in a method of manufacturing the exposure apparatus in accordance with the embodiment of the present invention.

FIG. 7 is a flowchart for explaining an adjusting step (e.g., a measuring step and a correcting step) in a method of manufacturing an exposure apparatus. In the following, with reference to FIG. 7, the method of manufacturing the exposure apparatus will be explained. When the individual optical members, stages, and the like in the embodiment shown in FIG. 1 are connected to each other electrically, mechanically, or optically in order to achieve functions mentioned above, the exposure apparatus in accordance with this embodiment can be assembled. Without being restricted to the exposure apparatus of overlapping exposure type, the method of manufacturing the exposure apparatus is also applicable to exposure apparatus of normal exposure type. Here, upon manufacturing and assembling the illumination optical system including the blind imaging optical system 100 and the projection optical system PL, processing errors of lenses constituting the individual optical systems and assembling errors of the individual optical systems may accumulate as mentioned above. As a consequence, even when aberrations of the optical systems are favorably corrected in terms of design, actual aberrations of the optical systems in the state mounted in the exposure apparatus may not always be favorable.

Therefore, in this embodiment, optical characteristics in the exposure area formed on the plate P are measured after the exposure apparatus is assembled (S101). Specifically, the reticle blind members RB1, RB2 are positioned at predetermined positions, and a predetermined test reticle TR is set on the reticle stage RS. While having substantially the same configuration as that of a normal reticle R for transferring a pattern, the test reticle TR is formed with a pair of scale marks extending in two directions (X and Y directions) instead of the circuit pattern. In the measuring step, a pair of scale marks in the test reticle TR are preliminary exposed onto the plate P by way of the projection optical system PL.

As a result, a pair of scale marks on the test reticle TR and the edges of openings of reticle blind members RB1, RB2 are transferred onto the plate P. The above-mentioned preliminary exposure onto the plate P is repeated a plurality of times while a part of all of the optical members in the blind imaging optical system 100 are moved in the optical axis direction, i.e., while the opening images of reticle blind members (RB1, RB2) are defocused. When the sizes, forms, and positions of the reticle blind members (RB1, RB2) burned in under various focusing states are thus read out according to the scale marks, the focusing positions of reticle blind members RB1, RB2, and the aberrations remaining in the exposure optical system (including the blind imaging optical system 100 and projection optical system PL) are measured. If the reticle blind members RB1, RB2 and the plate stage PS are moved in the optical axis direction, then the focus of opening images of reticle blind members RB1, RB2 can be shifted.

Usually, the state of aberrations of the projection optical system PL as a unit has fully been adjusted before it is mounted on the exposure apparatus, and its optical characteristics in terms of design are defined much more strictly than those of the illumination optical system in terms of design. Therefore, the remaining aberrations measured upon preliminary exposure can be considered remaining aberrations of the blind imaging optical system 100 in practice. Hence, based on the relationship between the movement, shift, inclination, decentering, and rotation of each optical member and aberrations to be corrected (species and amounts thereof) determined beforehand, the remaining aberrations of the blind imaging optical system 100 are corrected according to the measured state of aberrations. For simplifying the specific explanation, a case where distortion remains in the blind imaging optical system will be assumed in the following.

In this case, the rotationally symmetrical aberration component (such as the rotationally symmetrical component of distortion) and rotationally asymmetrical aberration component (such as the rotationally asymmetrical component of distortion) are extracted from the results of measurement of optical characteristics in the blind imaging optical system 100 (S102). Then, a predetermined optical member is moved by a predetermined amount according to thus extracted rotationally symmetrical aberration component, so as to correct the rotationally symmetrical aberration component (S103). In the step of correcting (adjusting) the rotationally symmetrical aberration component, for example, the lens L13 in the blind imaging optical system 100 is moved along the optical axis AX in order to correct the rotationally symmetrical distortion, the lens L14 is moved along the optical axis AX in order to correct the change in magnification caused by the movement of the lens L13, and the lenses L1 to L5 are integrally moved along the optical axis AX in order to correct the deviation in focus caused by the movements of lenses L13 and L14.

Subsequently, a predetermined optical member is moved by a predetermined amount according to the extracted rotationally asymmetrical aberration component (such as the rotationally asymmetrical distortion component), so as to correct the rotationally asymmetrical aberration component (such as the rotationally asymmetrical distortion component) (S104). In the step of correcting (adjusting) the rotationally asymmetrical aberration component, for example, the lens L11 in the blind imaging optical system 100 is shifted alone along a plane orthogonal to the optical axis AX, so as to correct the decentering distortion while hardly generating image surface tilting. Here, as mentioned above, the unformity in illuminance as an optical characteristic on the reticle R or plate P may deteriorate in accordance with correction (adjustment) of the blind imaging optical system 100. Also, the telecentricity as an optical characteristic on the reticle R or plate P may deteriorate in accordance with correction (adjustment) of the blind imaging optical system 100. In the case where optical characteristics (illumination characteristics) of the illumination optical system including the blind imaging optical system 100 deteriorate due to the correction (adjustment) of rotationally symmetrical or rotationally asymmetrical aberration, it is preferred that a step of correcting (adjusting) the deterioration in optical characteristics is carried out.

Therefore, for example, at least one optical member (lens or the like) constituting the first relay optical system 29 disposed in the optical path between the flyeye integrator 27 and the reticle blind members RB1, RB2 is moved along the optical axis AX, so as to correct the deterioration concerning of evenness of illumination on the reticle R or plate P generated upon the adjustment of optical characteristics in the blind imaging optical system 100 (S105). Also, the flyeye integrator 27 or collector lens 25 is decentered with respect to the optical axis AX (moved in a direction orthogonal to the optical axis AX), for example, so as to correct the deterioration of telecentricity caused by the adjustment of optical characteristics in the blind imaging optical system 100 (S106). As in the foregoing, in order to correct (adjust) the optical characteristics deteriorated by the above-mentioned steps (S103, S104) in the illumination optical system including the blind imaging optical system 100, it is preferred that at least one of the illumination correcting step (S105) and telecentricity correcting step (S106) is carried out.

The foregoing aberration correction and aberration state verification (measurement) are thus repeated, whereby the step of adjusting optical characteristics of the blind imaging optical system 100 and, consequently, the step of adjusting the whole exposure optical system including the illumination optical system are completed (S107).

A method of manufacturing an exposure apparatus using the adjusting method shown in FIG. 7 will now be explained briefly in the whole manufacturing flow. First, prior to the steps shown in FIG. 7, an assembling step including a step of installing the illumination optical system including the illumination area forming optical system (blind imaging optical system) for forming the illumination area with a mask onto a frame of the exposure apparatus and a step of installing the projection optical system for projecting a pattern image of the mask to a photosensitive substrate onto the frame of the exposure apparatus is carried out. Thereafter, the measuring step (S101), extracting step (S102), correcting or adjusting steps (S103 to S106), and verifying step (S107) are carried out sequentially as shown in FIG. 7, whereby an exposure apparatus having excellent optical performances can be manufactured.

The above-mentioned adjusting technique is applicable not only to the method of manufacturing the exposure apparatus, but also to methods of manufacturing microdevices using the exposure apparatus. In this case, the above-mentioned adjusting technique can be carried out as appropriate according to changes in the size and form of illumination area on the reticle R due to positional changes of the reticle blind members RB1, RB2 acting as an illumination area defining unit. In order to further favorably adjust optical performances of the blind imaging optical system and illumination optical system in the adjusting method shown in FIG. 7, it is preferred that the illumination optical system and projection optical system satisfy conditional expression (1) which will be explained later.

Though optical characteristics of the blind imaging optical system 100 are measured upon preliminary exposure in the foregoing explanations, the photoelectric detector 50 constituted by a photoelectric sensor having a pinhole or the like may be disposed on the plate stage PS as shown in FIG. 1, so as to detect edge positions of the openings of reticle blind members RB1, RB2 according to changes in the quantity of received light while scanning the pinhole, thereby measuring aberrations remaining in the blind imaging optical system 100. Also, a two-dimensional imaging device such as CCD and a relay optical system may be used as the photoelectric detector 50, so as to directly detect edge positions of the openings of the reticle blind members RB1, RB2 upon image processing, thereby measuring the remaining aberrations of the blind imaging optical system 100.

Taking account of the fact that the reticle blind members RB1, RB2 are defocused, edge positions of the openings of reticle blind members RB1, RB2 may be detected according to changes in the quantity of light incident on the scanning CCD instead of the pinhole, so as to measure the remaining aberrations in the blind imaging optical system 100. Also, the reticle blind members RB1, RB2 may be provided with an offset beforehand so that focusing surfaces of the reticle blind members RB1, RB2 can be measured, whereby the remaining aberrations in the blind imaging optical system 100 may be measured directly. Though the measurement is effected on the plate P optically conjugate with the reticle R or a surface optically conjugate with the plate P (in the case where light is received by a CCD by way of a relay optical system) in the foregoing explanation, it may also be carried out at the surface of reticle R. Namely, in general, the measurement can be carried out at the position identical to or optically conjugate with the reticle R (including the position of plate P).

In this embodiment, the blind imaging optical system 100 and projection optical system PL satisfy the following conditional expression (1):

$$0.01 < NA1/(NA2 \times \beta) < 6 \tag{1}$$

where NA1 is the maximum numerical aperture (0.6 in this embodiment) of the blind imaging optical system 100 on the object side (the reticle blind side opposite from the mask side), NA2 is the maximum numerical aperture of the projection optical system PL on the image side (plate side), and P is the absolute value (4.44 in this embodiment) of imaging magnification of the blind imaging optical system 100 as mentioned above.

When the value of conditional expression (1) is within the range defined by its upper and lower limits, favorable imaging performances can fully be yielded from the apparatus while its size is kept relatively small if a part of the illumination optical system (blind imaging optical system 100 or the like) is adjusted. For exhibiting further favorable effects, it is more preferred that the upper limit of conditional expression (1) be set to 4. Specific configurational examples of the projection optical system PL satisfying conditonal expression (1) in combination with the above-mentioned blind imaging optical system 100 will now be explained.

Figure 8:
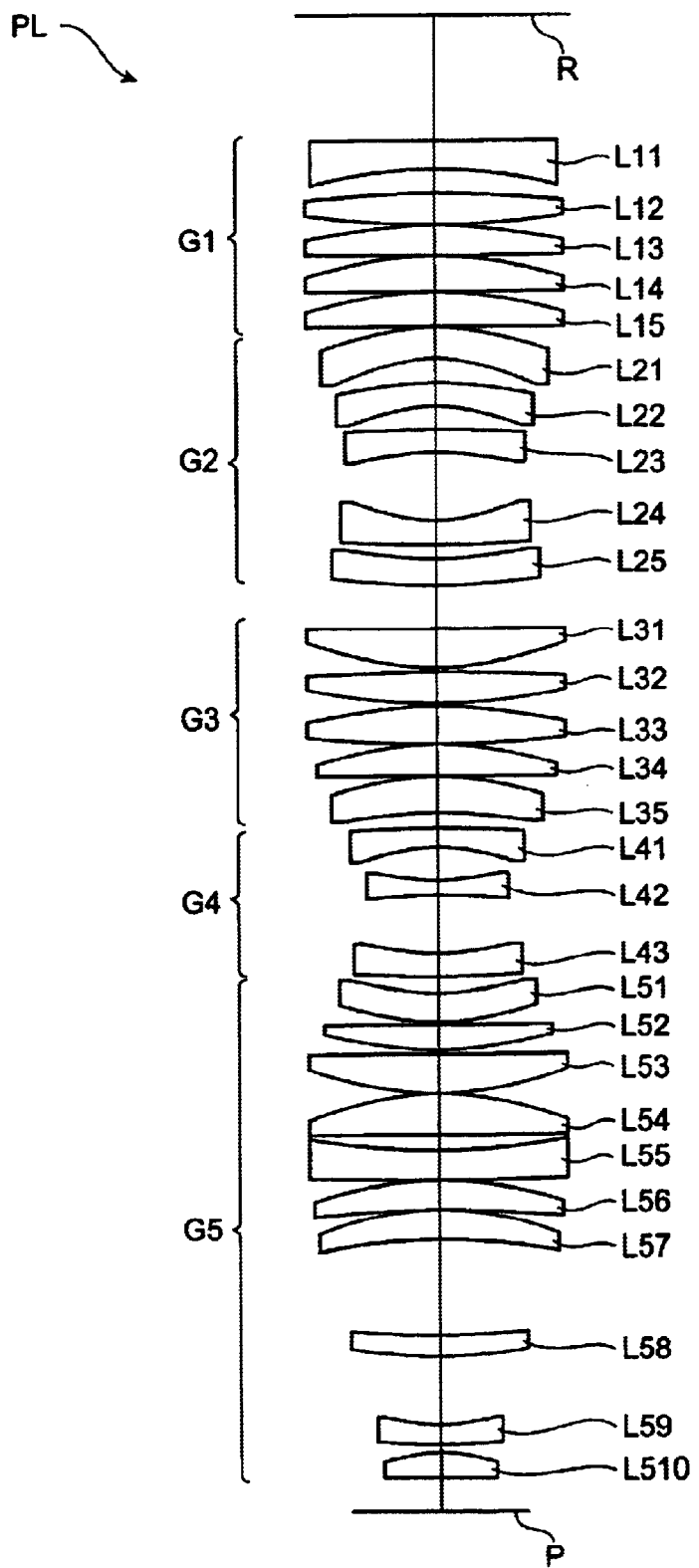
FIG. 8 is a view showing the lens configuration of a first configurational example of a projection optical system PL in accordance with the embodiment of the present invention.

FIG. 8 is a view showing the lens configuration of the projection optical system in accordance with a first configurational example. The projection optical system PL in accordance with the first configurational example is an optical system telecentric on both sides. The projection optical system PL comprises, successively from the object side (reticle R side), a first lens group G1 having a positive refracting power, a second lens group G2 having a negative refracting power, a third lens group G3 having a positive refracting power, a fourth lens group G4 having a negative refracting power, and a fifth lens group G5 having a positive refracting power.

Specifically, the first lens group G1 comprises, successively from the object side, a plane-concave lens L11 having a planar surface directed onto the object side, a biconvex lens L12, a biconvex lens L13, a biconvex lens L14, and a biconvex lens L15. The second lens group G2 comprises, successively from the object side, a negative meniscus lens L21 having a convex surface directed onto the object side, a negative meniscus lens L22 having a convex surface directed onto the object side, a meniscus lens L23 having a convex surface directed onto the object side, a negative meniscus lens L24 having a concave surface directed onto the object side, and a negative meniscus lens L25 having a concave surface directed onto the object side. The third lens group G3 comprises, successively from the object side, a negative meniscus lens L31 having a concave surface directed onto the object side, a biconvex lens L32, a biconvex lens L33, a biconvex lens L34, and a positive meniscus lens L35 having a convex surface directed onto the object side.

The fourth lens group G4 comprises, successively from the object side, a biconcave lens L41, a biconcave lens L42, and a negative meniscus lens L43 having a concave surface directed onto the object side. The fifth lens group G5 comprises, successively from the object side, a positive meniscus lens L51 having a concave surface directed onto the object side, a positive meniscus lens L52 having a concave surface directed onto the object side, a biconvex lens L53, a biconvex lens L54, a negative meniscus lens L55 having a concave surface directed onto the object side, a positive meniscus lens L56 having a convex surface directed onto the object side, a positive meniscus lens L57 having a convex surface directed onto the object side, a positive meniscus lens L58 having a concave surface directed onto the object side, a biconcave lens L59, and a positive meniscus lens L510 having a convex surface directed onto the object side.

The following Table 2 shows values of various items of the project optical system PL in accordance with the first configurational example. In "Main Items" in Table 2, NA2 indicates the maximum numerical aperture of the projection optical system PL on the image side (plate P side). In "Lens Items" in Table 2, the surface number in the first column indicates the number of each surface counted from the object side, letter r in the second column indicates the radius of curvature (mm) of each surface, letter d in the third column indicates the axial space, i.e., surface separation (mm), between each pair of neighboring surfaces, and letter n in the fourth column indicates the refractive index with respect to KrF excimer laser light ($\lambda$=248 nm). In the first configurational example, all the optical members constituting the projection optical system PL are formed from synthetic silica materials having the same refractive index.

TABLE 2

{Main Items}

NA2 = 0.3
{Lens Items}

| | r | d | n | |
|---|---|---|---|---|
| | (reticle surface) | 100.54099 | | |
| 1 | ∞ | 23.49989 | 1.508389 | (L11) |
| 2 | 327.21806 | 16.60623 | | |
| 3 | 745.99255 | 24.29147 | 1.508389 | (L12) |
| 4 | −792.67400 | 1.00000 | | |
| 5 | 477.75742 | 25.30887 | 1.508389 | (L13) |
| 6 | −1067.61000 | 1.00000 | | |
| 7 | 397.56382 | 26.07925 | 1.508389 | (L14) |
| 8 | −1506.22800 | 1.00000 | | |
| 9 | 308.67554 | 27.77416 | 1.508389 | (L15) |
| 10 | −1711.86500 | 1.00000 | | |
| 11 | 255.43901 | 19.44571 | 1.508389 | (L21) |
| 12 | 134.49939 | 21.21029 | | |
| 13 | 392.48722 | 17.71194 | 1.508389 | (L22) |
| 14 | 166.81409 | 21.72514 | | |
| 15 | 2316.17366 | 17.02197 | 1.508389 | (L23) |
| 16 | 257.82570 | 58.86230 | | |
| 17 | −127.30481 | 18.70569 | 1.508389 | (L24) |
| 18 | −2339.58700 | 12.42892 | | |
| 19 | −327.18173 | 20.59271 | 1.508389 | (L25) |
| 20 | −620.90663 | 37.00065 | | |
| 21 | −1533.81200 | 30.36053 | 1.508389 | (L31) |
| 22 | −212.87813 | 1.00000 | | |
| 23 | 1152.51610 | 29.21679 | 1.508389 | (L32) |
| 24 | −347.77220 | 1.00000 | | |
| 25 | 366.50812 | 29.12826 | 1.508389 | (L33) |
| 26 | −816.19208 | 1.00000 | | |
| 27 | 289.18973 | 25.66665 | 1.508389 | (L34) |
| 28 | −3215.23700 | 1.02318 | | |
| 29 | 221.16412 | 29.15903 | 1.508389 | (L35) |
| 30 | 362.33564 | 13.19690 | | |
| 31 | −1429.49800 | 16.90899 | 1.508389 | (L41) |
| 32 | 128.70362 | 25.44667 | | |
| 33 | −171.40580 | 13.89425 | 1.508389 | (L42) |
| 34 | 241.11901 | 49.13964 | | |
| 35 | −150.49549 | 16.58890 | 1.508389 | (L43) |
| 36 | −4555.02600 | 13.58757 | | |
| 37 | −254.20194 | 24.13589 | 1.508389 | (L51) |
| 38 | −200.61407 | 1.00000 | | |
| 39 | −3182.49700 | 22.23957 | 1.508389 | (L52) |
| 40 | −292.36148 | 1.00000 | | |
| 41 | 2596.31870 | 32.65875 | 1.508389 | (L53) |
| 42 | −225.72431 | 1.00000 | | |
| 43 | 228.47592 | 37.12921 | 1.508389 | (L54) |
| 44 | −1062.27300 | 10.36255 | | |
| 45 | −480.45072 | 24.00219 | 1.508389 | (L55) |
| 46 | −3004.94500 | 1.00000 | | |
| 47 | 269.60675 | 22.95075 | 1.508389 | (L56) |
| 48 | 773.94795 | 1.00000 | | |
| 49 | 318.85934 | 22.48602 | 1.508389 | (L57) |
| 50 | 462.73199 | 74.40343 | | |
| 51 | −786.03086 | 16.99427 | 1.508389 | (L58) |
| 52 | −365.94219 | 52.49696 | | |
| 53 | −149.65954 | 12.21313 | 1.508389 | (L59) |
| 54 | 459.79301 | 5.32364 | | |
| 55 | 99.59299 | 18.48013 | 1.508389 | (L510) |
| 56 | 794.31006 | 30.00000 | | |
| | (plate surface) | | | |

{Values Corresponding to Conditional Expression}

NA1 = 0.6
β = 4.44
NA2 = 0.3
(1) NA1/(NA2 × β) = 0.45

FIGS. 9A to 9D are charts showing spherical aberration, astigmatism, distortion, and lateral aberration of the projection optical system in accordance with the first configurational example, respectively. In FIG. 9A, NA indicates the above-mentioned NA2, i.e., the maximum numerical aperture on the image side. In FIGS. 9B to 9D, Y indicates the image height (mm). In the astigmatism chart of FIG. 9B, broken line M and solid line S indicate meridional and sagittal image surfaces, respectively. As can be seen from each aberration chart, the projection optical system PL in accordance with the first configurational example has excellent imaging performances.

Figure 10:
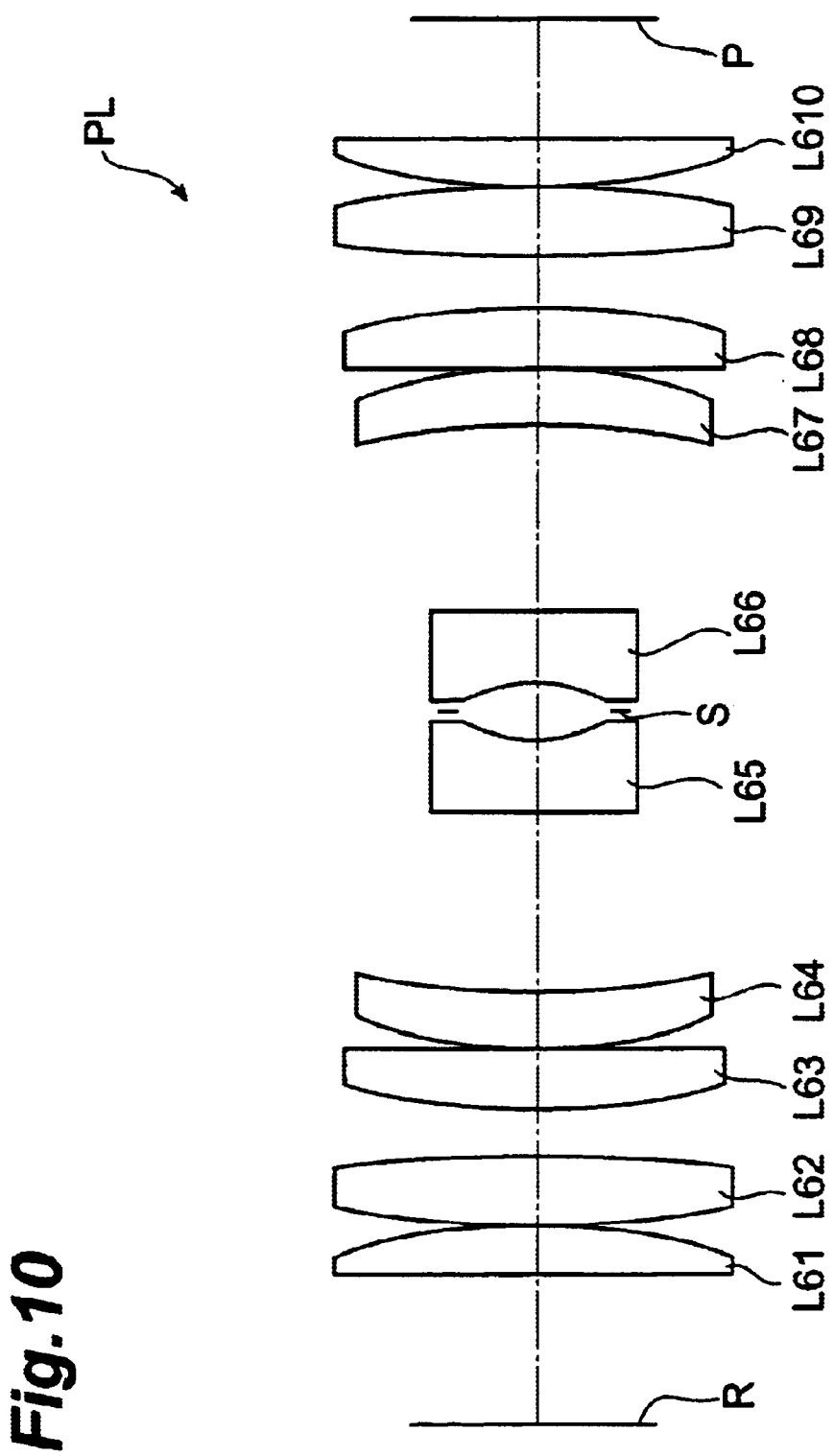
FIG. 10 is a view showing the lens configuration of a second configurational example of the projection optical system.

FIG. 10 is a view showing the projection optical system in accordance with a second configurational example. The projection optical system PL in accordance with the second configurational example is configured symmetrical about an aperture stop S. Specifically, the projection optical system PL comprises, successively from the object side (reticle R side), a positive meniscus lens L61 having a concave surface directed onto the object side, a biconvex lens L62, a positive meniscus lens L63 having a convex surface directed onto the object side, a positive meniscus lens L64 having a convex surface directed onto the object side, a biconcave lens L65, the aperture stop S, a biconcave lens L66, a positive meniscus lens L67 having a concave surface directed onto the object side, a positive meniscus lens L68 having a concave surface directed onto the object side, a biconvex lens L69, and a positive meniscus lens L610 having a convex surface directed onto the object side.

The following Table 3 shows values of various items of the project optical system PL in accordance with the second configurational example. In "Main Items" in Table 3, NA2 indicates the maximum numerical aperture of the projection optical system PL on the image side (plate P side). In "Lens Items" in Table 3, the surface number in the first column indicates the number of each surface counted from the object surface, letter r in the second column indicates the radius of curvature of each surface, letter d in the third column indicates the axial space, i.e., surface separation, between each pair of neighboring surfaces, and letter n in the fourth column indicates the refractive index with respect to KrF excimer laser light (λ248.4 nm). In the second configurational example, all the optical members constituting the projection optical system PL are formed from molten silica materials having the same refractive index.

TABLE 3

{Main Items}

NA2 = 0.18
{Lens Items}

| | r | d | n | |
|---|---|---|---|---|
| | (reticle surface) | 125.000 | | |
| 1 | −621.447 | 6.800 | 1.50832 | (L61) |
| 2 | −123.233 | 0.680 | | |
| 3 | 142.712 | 12.000 | 1.50832 | (L62) |
| 4 | −202.829 | 8.370 | | |
| 5 | 115.747 | 8.490 | 1.50832 | (L63) |
| 6 | 609.474 | 0.500 | | |
| 7 | 70.825 | 9.660 | 1.50832 | (L64) |
| 8 | 132.376 | 31.158 | | |
| 9 | −3051.500 | 12.000 | 1.50832 | (L65) |
| 10 | 31.279 | 4.565 | | |
| 11 | ∞ | 4.565 | (aperture stop S) | |
| 12 | −31.279 | 12.000 | 1.50832 | (L66) |
| 13 | 3051.500 | 31.158 | | |
| 14 | −132.376 | 9.660 | 1.50832 | (L67) |
| 15 | −70.825 | 0.500 | | |
| 16 | −609.474 | 8.490 | 1.50832 | (L68) |
| 17 | −115.747 | 8.370 | | |

TABLE 3-continued

| 18 | 202.829 | 12.000 | 1.50832 | (L69) |
|---|---|---|---|---|
| 19 | −142.712 | 0.680 | | |
| 20 | 123.233 | 6.800 | 1.50832 | (L610) |
| 21 | 621.447 (plate surface) | 125.000 | | |

{Values Corresponding to Conditional Expression}

NA1 = 0.6
β = 4.44
NA2 = 0.18
(1)NA1/(NA2 × β) = 0.75

Figure 11:
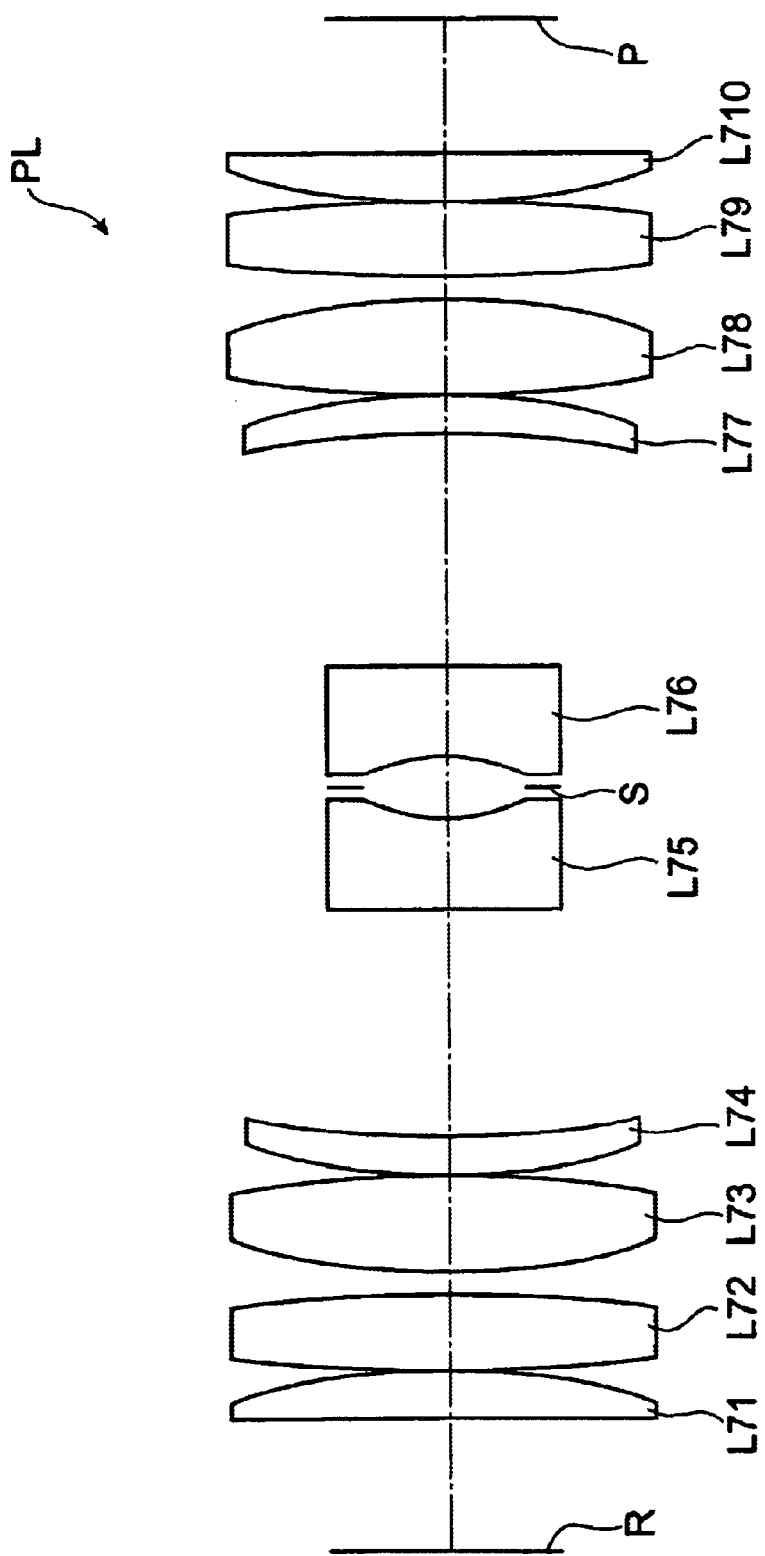
FIG. 11 is a view showing the lens configuration of a third configurational example of the projection optical system.

FIG. 11 is a view showing the lens configuration of the projection optical system in accordance with a third configurational example. As with the second configurational example, the projection optical system PL in accordance with the third configurational example is configured symmetrical about an aperture stop S. Specifically, the projection optical system PL comprises, successively from the object side (reticle R side), a positive meniscus lens L71 having a concave surface directed onto the object side, a biconvex lens L72, a biconvex lens L73, a positive meniscus lens L74 having a convex surface directed onto the object side, a biconcave lens L75, the aperture stop S, a biconcave lens L76, a positive meniscus lens L77 having a concave surface directed onto the object side, a biconvex lens L78, a biconvex lens L79, and a positive meniscus lens L710 having a convex surface directed onto the object side.

The following Table 4 shows values of various items of the project optical system PL in accordance with the third configurational example. In "Main Items" in Table 3, NA2 indicates the maximum numerical aperture of the projection optical system PL on the image side (plate P side). In "Lens Items" in Table 4, the surface number in the first column indicates the number of each surface counted from the object surface, letter r in the second column indicates the radius of curvature of each surface, letter d in the third column indicates the axial space, i.e., surface separation, between each pair of neighboring surfaces, and letter n in the fourth column indicates the refractive index with respect to KrF excimer laser light (λ=248.4 nm). As in the second configurational example, all the optical members constituting the projection optical system PL in the third configurational example are formed from molten silica materials having the same refractive index.

TABLE 4

{Main Items}

NA2 = 0.18

{Lens Items}

| | r | d | n | |
|---|---|---|---|---|
| | (reticle surface) | 125.000 | | |
| 1 | 607.544 | 6.000 | 1.50832 | (L71) |
| 2 | 122.166 | 0.500 | | |
| 3 | 359.370 | 11.752 | 1.5083 | (L72) |
| 4 | 267.589 | 3.400 | | |
| 5 | 105.008 | 14.000 | 1.50832 | (L73) |
| 6 | −351.306 | 0.500 | | |
| 7 | 73.423 | 6.469 | 1.50832 | (L74) |
| 8 | 147.734 | 35.243 | | |
| 9 | −532.703 | 13.874 | 1.50832 | (L75) |
| 10 | 32.569 | 4.500 | | |

TABLE 4-continued

| 11 | ∞ | 4.500 | (aperture stop s) | |
|---|---|---|---|---|
| 12 | 32.569 | 13.874 | 1.50832 | (L76) |
| 13 | 532.703 | 35.243 | | |
| 14 | 147.734 | 6.469 | 1.50832 | (L77) |
| 15 | −73.423 | 0.500 | | |
| 16 | 351.306 | 14.000 | 1.50832 | (L78) |
| 17 | −105.008 | 3.400 | | |
| 18 | 267.589 | 11.752 | 1.50832 | (L79) |
| 19 | −359.370 | 0.500 | | |
| 20 | 122.166 | 6.000 | 1.50832 | (L710) |
| 21 | 607.544 (plate surface) | 125.000 | | |

{Values Corresponding to Conditional Expression}

NA1 = 0.6
β = 4.44
NA2 = 0.18
(1) NA1/(NA2 × β) = 0.75

The above-mentioned embodiment explains the present invention in relation to an exposure apparatus for exposing a transfer pattern of a mask (reticle R) onto a photosensitive substrate (plate P) in an overlapping manner. As mentioned above, however, the method of adjusting the blind imaging optical system within the exposure apparatus (or method of adjusting the blind imaging optical system at the time of manufacturing the exposure apparatus) explained with reference to FIG. 5 and the adjustment (measuring step, correcting step, or the like) in the method of manufacturing the exposure apparatus explained with reference to FIG. 7 are also applicable to exposure apparatus of normal exposure type without being restricted to those of overlapping exposure type. Similarly, all the other perspectives of the present invention explained in relation to the above-mentioned embodiment, e.g., the adjustment of optical characteristics of the imaging optical system, the adjustment of the deterioration of other optical characteristics caused by the former adjustment, the definition by conditional expression (1), and the like are also applicable to exposure apparatus of normal exposure type. In particular, the fact that the linearity and directivity in images of opening edges in the illumination area defining unit are secured on the mask is advantageous when carrying out favorable exposure in a so-called step-and-scan type exposure apparatus. In the following, exposure apparatus of normal exposure type carrying out no overlapping exposure will be explained as modified examples of the above-mentioned embodiment.

Figure 12:
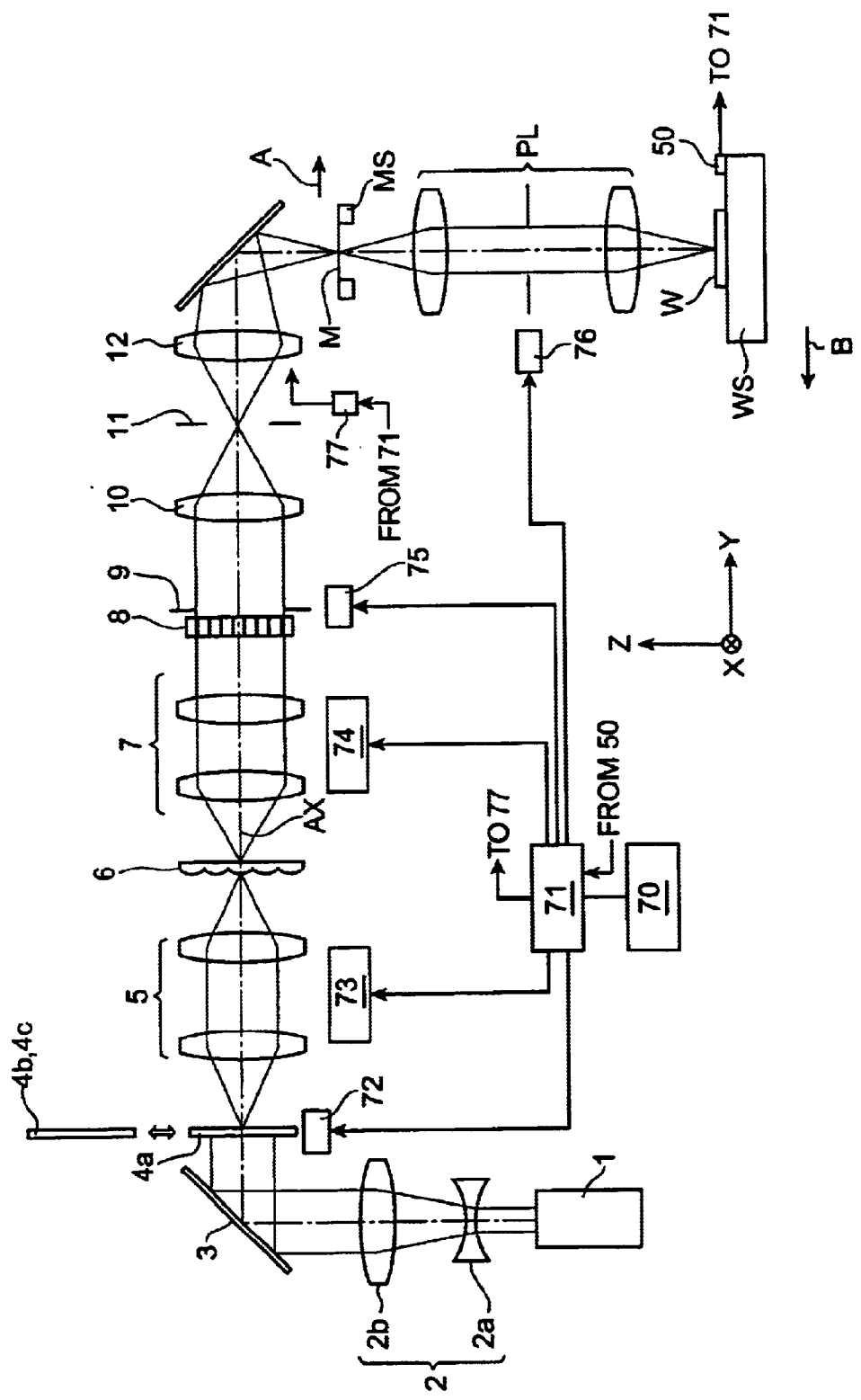
FIG. 12 is a view schematically showing the configuration of the exposure apparatus of normal exposure type in accordance with a first modified example of the embodiment.

FIG. 12 is a view schematically showing the configuration of the normal exposure type exposure apparatus in accordance with the first modified example of this embodiment. In FIG. 12, Z axis is set along the normal direction of a wafer W which is a photosensitive substrate, Y axis is set parallel to the paper surface of FIG. 12 within the wafer plane, and X axis is set in a direction perpendicular to the paper surface of FIG. 12 within the wafer plane. In FIG. 12, the illumination optical apparatus is set so as to carry out annular illumination.

The exposure apparatus of FIG. 12 comprises an excimer laser light source for supplying light having a wavelength of 248 nm (KrF) or 193 nm (ArF), for example, as a light source 1 for supplying exposure light (illumination light) A substantially parallel luminous flux emitted from the light source 1 along the Z direction has a thin rectangular cross section extending along the X direction and is made incident on a beam expander 2 comprising a pair of lenses 2a and 2b.

The lenses 2a and 2b have negative and positive refracting powers within the paper surface of FIG. 12 (within the YZ plane), respectively. Therefore, the luminous flux incident on the beam expander 2 is enlarged within the paper surface of FIG. 12, so as to be shaped into a luminous flux having a predetermined rectangular cross section.

The substantially parallel luminous flux having traveled by way of the beam expander 2 acting as a shaping optical system is deflected by a bending mirror 3 into the Y direction, and then is made incident on a diffraction optical element (DOE) 4a for annular illumination. In general, the diffraction optical element is constructed by forming a glass substrate with steps having a pitch similar to the wavelength of exposure light (illumination light), and acts to diffract the incident beam with a desirable angle. Specifically, when a parallel luminous flux having a rectangular cross section is incident, the diffraction optical element 4a for annular illumination functions to form a ring-shaped optical intensity distribution in its far field (or Fraunhofer diffraction area).

The diffraction optical element 4a is configured so as to be freely insertable into and retractable from the illumination optical path, and is switchable from/to the diffraction optical element 4b for quadrupolar illumination and the diffraction optical element 4c for normal circular illumination. Configurations and operations of the diffraction optical element 4b for quadrupolar illumination and the diffraction optical element 4c for normal circular illumination will be explained later in detail. The switching among the diffraction optical element 4a for annular illumination, the diffraction optical element 4b for quadrupolar illumination, and the diffraction optical element 4c for normal circular illumination is carried out by a first driving system 72 which operates according to an instruction from a control system 71. By way of an input means 70 such as a keyboard, information concerning various kinds of masks to be sequentially exposed according to the step-and-repeat system or step-and-scan system and the like are fed to the control system 71.

The luminous flux having traveled by way of the diffraction optical element 4a is made incident on an a focal zoom lens (variable power relay optical system) 5 for changing the annular ratio, which will be explained later in detail. The a focal zoom lens 5 is configured so as to be able to continuously change the magnification within a predetermined range while keeping the diffraction optical element 4a and the entrance surface of a microlens array (microflyeye lens) 6, which will be explained later, in an optically substantially conjugate relationship and maintaining an a focal system (an optical system with no focus). Here, the magnification of the a focal zoom lens 5 is changed by a second driving system 73 which operates according to an instruction from the control system 71.

Thus, the luminous flux having traveled by way of the diffraction optical element 4a forms a ring-shaped optical intensity distribution at the pupil surface of the a focal zoom lens 5. The light from the ring-shaped optical intensity distribution is emitted as a substantially parallel luminous flux from the a focal zoom lens 5 and is made incident on the microlens array 6. Here, the luminous flux is made incident on the entrance surface of the microlens array 6 from oblique directions substantially symmetrical about the optical axis AX. Due to the power-varying action of the zoom lens (variable power optical system) 5 for changing the annular ratio, the angle of incidence of the luminous flux obliquely incident on the microlens array 6 changes, thereby altering the annular ratio of a secondary light source shaped like a zone (an optical intensity distribution shaped like a zone or the like formed at the pupil of the illumination optical system) which will be explained later. The microlens array 6 is an optical element made of a number of minute lenses, each having a positive refracting power with a regular hexagonal shape, which are densely arranged in a matrix. In general, the microlens array is constructed by forming a group of minute lenses upon etching a plane parallel plate, for example.

Here, each minute lens constituting the microlens array is smaller than each lens element constituting the flyeye integrator (flyeye lens). Unlike the flyeye integrator constituted by lens elements separated from each other, a number of minute lenses are integrally formed in the microlens array without being separated from each other. However, the microlens array is identical to the flyeye integrator in that lens elements each having a positive refracting power are arranged in a matrix. In FIG. 12, for clarification of the drawing, the number of minute lenses constituting the microlens array 6 is shown much smaller than the actual one.

Therefore, the luminous flux incident on the microlens array 6 is two-dimensionally split by a number of minute lenses, whereby one ring-shaped light source (light-converging point) is formed at the image-side focal plane of each minute lens. By way of a zoom lens (variable power optical system) 7 for changing the σ value, luminous fluxes from a number of light sources formed at the image-side focal plane of the microlens array 6 illuminate, in a superposing manner, the flyeye integrator 8 acting as an optical integrator. Here, the σ value is defined as σ=NAi/NAo=R2/R1, where R1 is the size (diameter) of the pupil of the projection optical system PL, R2 is the size (diameter) of the illumination luminous flux or light source image formed at the pupil of the projection optical system PL, NAo is the numerical aperture of projection optical system PL on the mask (reticle) M side, and NAi is the numerical aperture of the illumination optical system illuminating the mask (reticle) M as mentioned above.

The zoom lens 7 is a relay optical system which can continuously change the focal length in a predetermined range, and makes the image-side focal plane of the microlens array 6 and the image-side focal plane of the flyeye integrator 8 optically substantially conjugate with each other. In other words, the zoom lens 7 substantially places the image-side focal plane of the microlens array 6 and the entrance surface of the flyeye integrator 8 into a Fourier transform relationship.

As a consequence, luminous fluxes from a number of ring-shaped light sources formed at the image-side focal plane of the microlens array 6 form an optical intensity distribution based on the convolution of rings and regular hexagons, i.e., a annular illumination field centered at the optical axis AX, at the image-side focal plane of the zoom lens 7 (and consequently at the entrance surface of the flyeye integrator 8). The size of the annular illumination field varies depending on the focal length of the zoom lens 7. The focal length of the zoom lens 7 is changed by a third driving system 74 which operates according to an instruction from the control system 71.

The flyeye integrator 8 is an optical member corresponding to the flyeye integrator 27 in the above-mentioned embodiment, and is constituted by a number of lens elements, each having a positive refracting power, arranged densely in a matrix. Each of the lens elements constituting the flyeye integrator 8 has a rectangular cross section similar to the form of the illumination field to be formed on the mask (and consequently the form of the exposure area to be formed on the wafer). In each lens element constituting the flyeye integrator 8, the surface on the entrance side is shaped like a sphere having a convex surface directed onto the entrance side, whereas the surface on the exit side is shaped like a sphere having a convex surface directed onto the exit side.

As a consequence, the luminous flux incident on the flyeye integrator 8 is two-dimensionally split by a number of lens elements, whereby a number of light sources are formed on the image-side focal planes of the individual lens elements on which the luminous flux is incident, respectively. Thus, a substantially planar light source (hereinafter referred to as "secondary light source") shaped like a annulus having substantially the same optical intensity distribution as that of the illumination field formed by the luminous flux incident on the flyeye integrator 8 is formed at the image-side focal plane of the flyeye integrator 8 (and consequently at the pupil surface of the illumination optical system) The luminous flux from the annulus secondary light source formed at the image-side focal plane of the flyeye integrator 8 is made incident on an aperture stop 9 disposed nearby.

The aperture stop 9 is supported on a turret substrate (rotary plate; not depicted in FIG. 12) rotatable about a predetermined axis parallel to the optical axis AX. The turret substrate is circumferentially provided with a plurality of annular aperture stops having annular openings (light-transmitting portions) with different forms (annular ratios) and sizes (outer diameters), a plurality of quadrupolar aperture stops having quadrupolar openings with different forms (annular ratios) and sizes (outer diameters), and a plurality of circular aperture stops having circular openings with different sizes (outer diameters). Also, the turret substrate is configured so as to be rotatable about an axis, passing through the center point thereof, parallel to the optical axis AX. Therefore, upon rotating the turret substrate, one aperture stop selected from a number of aperture stops can be positioned in the illumination optical path. The turret substrate is rotated by a fourth driving system 75 which operates according to an instruction from the control system 71.

Since the annular secondary light source is formed at the image-side focal plane of the flyeye integrator 8 in FIG. 12, one annular aperture stop selected from a plurality of annular aperture stops is used as the aperture stop 9. Here, without being restricted to the turret type aperture stops, slide type aperture stops may be employed, for example. Also, an aperture stop which can change the size and form of the light-transmitting area as appropriate may be fixedly mounted within the illumination optical path. Further, an iris stop which can continuously change the circular opening diameter may be provided in place of a plurality of circular aperture stops.

The light from the secondary light source having traveled by way of the aperture stop 9 having the annular opening (light-transmitting portion) is subjected to the light-converging action of a condenser optical system 10, and then illuminates a mask blind 11, which acts as an illumination field stop, in a superposing manner. The mask blind 11 is an example of illumination area defining units. The luminous flux having traveled by way of the rectangular opening (light-transmitting portion) of the mask blind 11 is subjected to the light-converging action of an imaging optical system 12, and then illuminates a mask M in a superposing manner. Here, the imaging optical system 12 has the configuration and function similar to those of the blind imaging optical system 100 in the above-mentioned embodiment. The luminous flux transmitted through the pattern of the mask M forms a mask pattern image on a wafer W, which is a photosensitive substrate, by way of the projection optical system PL.

The mask M is mounted on a mask stage MS which is two-dimensionally movable within a plane (XY plane) perpendicular to the optical axis AX of the projection optical system PL. The direction indicated by arrow A is the scanning direction of the mask M, which is identical to the positive direction of Y axis. The direction indicated by arrow A in FIGS. 13 and 14 has the same meaning as above. On the other hand, the wafer W is mounted on a wafer stage WS two-dimensionally movable within a plane (XY plane) perpendicular to the optical axis AX of the projection optical system PL. The direction indicated by arrow B is the scanning direction of the wafer W, which is identical to the negative direction of Y axis. The direction indicated by arrow B in FIGS. 13 and 14 has the same meaning as above. According to positional signals (positional information from position detectors such as interferometers mounted within the respective stages) from the individual stages (RS, WS), the control system 71 drives and controls the driving system mounted within each stage (RS, WS). Thus, collective exposure or scanning exposure is carried out while the wafer W is two-dimensionally driven and controlled within the XY plane, whereby the pattern of the mask M is sequentially exposed to the individual exposure areas of the wafer W. The entrance pupil surface of the projection optical system PL is provided with a variable aperture stop for defining the numerical aperture of the projection optical system PL, whereas the variable aperture stop is driven by a fifth driving system 76 which operates according to an instruction from the control system 71.

In the collective exposure, a mask pattern is collectively exposed to each exposure area of the wafer according to a so-called step-and-repeat system. In this case, the illumination area on the mask M has a rectangular form approximating a square, and each lens element in the flyeye integrator 8 has a rectangular cross-sectional form approximating a square as well. In the scanning exposure, by contrast, the mask pattern is scan-exposed to each exposure area of the wafer while the mask and the wafer are moved relative to the projection optical system along the Y direction (scanning direction) indicated by the arrow of FIG. 12 according to a so-called step-and-scan system.

In this case, the illumination area on the mask M has a rectangular form in which the ratio of the shorter side to the longer side is 1:3, for example, and the cross section of each lens element of the flyeye integrator 8 has a rectangular form similar thereto. Namely, in the scanning exposure, the mask M and wafer W are moved relative to the projection optical system PL along a direction (scanning direction) optically corresponding to the shorter side direction in the cross-sectional form of a number of lens elements (optical elements) constituting the flyeye integrator 8 as an optical integrator. Here, the cross section refers to a section perpendicular to the optical axis. The configurations and operations for scanning exposure explained in the foregoing are similar to those in the example shown in FIG. 13, which will be explained later.

If the magnification of the a focal zoom lens 5 changes in the first modified example, both of the outer and inner diameters of the annular secondary light source change without changing its width (½ of the difference between the outer and inner diameters). In other words, under the action of the a focal zoom lens 5, both of the annular ratio and size (outer diameter) of the annular secondary light source change without altering its width. If the focal length of the zoom lens 7 changes, on the other hand, the overall form of the annular secondary light source will change similarly thereto. In other words, under the action of the zoom lens 7, both of the width and size (outer diameter) of the annular secondary light source change without altering its annular ratio.

The quadrupolar illumination obtained when the diffraction optical element 4b for quadrupolar illumination is set in place of the diffraction optical element 4a in the illumination optical path will now be explained in brief. The diffraction optical element 4b for quadrupolar illumination functions to form a four-point-like optical intensity distribution in its far field (or Fraunhofer diffraction area) when a parallel luminous flux having a rectangular cross section is incident thereon. Therefore, the luminous flux having traveled by way of the diffraction optical element 4b forms a four-point-like optical intensity distribution at the pupil surface of the a focal zoom lens 5. The light from this four-point-like optical intensity distribution is emitted as a substantially parallel luminous flux from the a focal zoom lens 5, so as to be made incident on the microlens array 6.

Thus, the luminous flux having traveled by way of the microlens array 6 and zoom lens 7 forms an optical intensity distribution based on the convolution of four points and regular hexagons, i.e., a quadrupolar illumination field composed of four regular hexagonal illumination fields which are eccentric with respect to the optical axis AX, at the entrance surface of the flyeye integrator 8. As a result, a secondary light source having an optical intensity substantially the same as that of the illumination field formed at the entrance surface, i.e., a quadrupolar secondary light source composed of four regular hexagonal planar light sources which are eccentric with respect to the optical axis AX, is formed at the image-side focal plane (and consequently at the pupil surface of the illumination optical system) In response to the switching from the diffraction optical element 4a to the diffraction optical element 4b, the annular aperture stop 9 is switched to the quadrupolar aperture stop.

The outer diameter (size) and the annular ratio (form) of the quadrupolar secondary light source can be defined as in the annular secondary light source. Namely, the outer diameter of the quadrupolar secondary light source is the diameter of the circle circumscribing the four planar light sources. The annular ratio of the quadrupolar secondary light source is the ratio (inner diameter/outer diameter) of the diameter of the circle inscribed in the four planar light sources to the diameter of the circle circumscribing the four planar light sources. In general, it is defined as σ=NAi/NAo=R2/R1 in multipolar illuminations such as quadrupolar illumination, where R2 is the size or diameter of the circle circumscribing the multipolar illumination luminous flux or multipolar light source images formed at the pupil of the projection optical system PL, and NAi is the numerical aperture defined by the size or diameter of the circle circumscribing the multipolar illumination luminous flux or multipolar light source images formed at the pupil of the projection optical system.

Thus, in the quadrupolar illumination in the first modified example, both of the outer diameter and annular ratio of the quadrupolar illumination can be altered upon changing the magnification of the a focal zoom lens 5 as in the annular illumination. Also, if the focal length of the zoom lens 7 is changed, the outer diameter of the quadrupolar secondary light source can be changed without altering its annular ratio.

In the annular illumination and multipolar illumination, as the annular-ratio-changing zoom lens (variable power optical system) 5 and the σ-variable zoom lens 7 cooperate with each other, the annular ratio can be changed while keeping the annular width constant, the annular width can be changed while keeping the annular ratio constant, and the annular ratio and the annular width can be changed positively, as a matter of course. Here, the annular width is defined by [(the outer diameter of annular light or outer diameter of a annular secondary light source)–(the inner diameter of annular light or inner diameter of the annular secondary light source)]/2, [(the diameter of the circle circumscribing multipolar light or diameter of the circle circumscribing a multipolar secondary light source)–(the diameter of the circle inscribed in the multipolar light or diameter of the circle inscribed in the multipolar secondary light source)]/2, and the like.

The normal circular illumination obtained when the diffraction optical element 4c for circular illumination is set in place of the diffraction optical element 4a or 4b in the illumination optical path will now be explained. The diffraction optical element 4c for circular illumination functions to form a circular optical intensity distribution in its far field (or Fraunhofer diffraction area) when a parallel luminous flux having a rectangular cross section is incident thereon. Therefore, the luminous flux having traveled by way of the diffraction optical element 4c forms a circular optical intensity distribution at the pupil surface of the a focal zoom lens 5. The light from this circular optical intensity distribution is emitted as a substantially parallel luminous flux from the a focal zoom lens 5, so as to be made incident on the microlens array 6.

Thus, the luminous flux having traveled by way of the microlens array 6 and zoom lens 7 forms an optical intensity distribution based on the convolution of a circle and regular hexagons, i.e., a circular illumination field, at the entrance surface of the flyeye integrator 8. As a result, a secondary light source having an optical intensity substantially the same as that of the illumination field formed at the entrance surface, i.e., a circular secondary light source, is formed at the image-side focal plane (and consequently at the pupil surf ace of the illumination optical system). In response to the switching from the diffraction optical element 4a or 4b to the diffraction optical element 4c, the annular or quadrupolar opening is switched to the circular opening in the aperture stop 9. In this case, the outer diameter of the circular secondary light source can be changed appropriately if the focal length of the zoom lens 7 is changed.

The switching operation for illumination conditions in the first modified example and the like will now be explained specifically. Information concerning various kinds of masks to be sequentially exposed according to the step-and-repeat system or step-and-scan system and the like are fed into the control system 71 by way of the input means 70 such as a keyboard. The control system 71 stores information such as the optimal line width (resolution) and focal depth for each kind of mask in its inner memory section, and supplies appropriate control signals to the first to fifth driving systems 72 to 76 in response to the input from the input means 70.

Namely, in the case of annular illumination under the optimal resolution and focal depth, the first driving system 72 positions the diffraction optical element 4a for annular illumination into the illumination optical path according to an instruction from the control system 71. For yielding a annular secondary light source having a desirable size (outer diameter) and form (annular ratio), the second driving system 73 sets the magnification of the a focal zoom lens according to an instruction from the control system 71, whereas the third driving system 74 sets the focal length of the zoom lens 7 according to an instruction from the control system 71. For restricting the annular secondary light source in a state favorably suppressing the loss in quantity of light, the fourth driving system 75 rotates the turret according to an instruction from the control system 71, so as to position a desirable annular aperture stop into the illumination optical path. The fifth driving system 76 drives the variable aperture stop of the projection optical system PL according to an instruction from the control system 71.

Further, when necessary, the second driving system 73 changes the magnification of the a focal zoom lens 5, and the third driving system 74 changes the focal length of the zoom lens 7, whereby the size and annular ratio of the annular secondary light source can be changed appropriately. In this case, the turret rotates in response to the change in the size and annular ratio of the annular secondary light source, so that the annular aperture stop having a desirable size and annular ratio is selected and positioned in the illumination optical path. Thus, while the quantity of light is hardly lost in the forming and restricting of the annular secondary light source, various kinds of annular illumination can be carried out with the size and annular ratio of the annular secondary light source being changed appropriately.

In the case of quadrupolar illumination under the optimal resolution and focal depth, the first driving system 72 positions the diffraction optical element 4b for quadrupolar illumination into the illumination optical path according to an instruction from the control system 71. For yielding a quadrupolar secondary light source having a desirable size (outer diameter) and form (annular ratio), the second driving system 73 sets the magnification of the a focal zoom lens 5 according to an instruction from the control system 71, whereas the third driving system 74 sets the focal length of the zoom lens 7 according to an instruction from the control system 71. For restricting the quadrupolar secondary light source in a state favorably suppressing the loss in quantity of light, the fourth driving system 75 rotates the turret according to an instruction from the control system 71, so as to position a desirable quadrupolar aperture stop into the illumination optical path. The fifth driving system 76 drives the variable aperture stop of the projection optical system PL according to an instruction from the control system 71.

Further, when necessary, the second driving system 73 changes the magnification of the a focal zoom lens 5, and the third driving system 74 changes the focal length of the zoom lens 7, whereby the size and annular ratio of the quadrupolar secondary light source can be changed appropriately. In this case, the turret rotates in response to the change in the size and annular ratio of the quadrupolar secondary light source, so that the quadrupolar aperture stop having a desirable size and annular ratio is selected and positioned in the illumination optical path. Thus, while the loss in quantity of light is favorably suppressed in the forming and restricting of the annular secondary light source, various kinds of quadrupolar illumination can be carried out with the size and annular ratio of the quadrupolar secondary light source being changed appropriately.

Finally, in the case of normal circular illumination under the optimal resolution and focal depth, the first driving system 72 positions the diffraction optical element 4c for circular illumination into the illumination optical path according to an instruction from the control system 71. For yielding a circular secondary light source having a desirable size (outer diameter), the second driving system 73 sets the magnification of the a focal zoom lens 5 according to an instruction from the control system 71, whereas the third driving system 74 sets the focal length of the zoom lens 7 according to an instruction from the control system 71. For restricting the circular secondary light source in a state favorably suppressing the loss in quantity of light, the fourth driving system 75 rotates the turret according to an instruction from the control system 71, so as to position a desirable circular aperture stop into the illumination optical path. The fifth driving system 76 drives the variable aperture stop of the projection optical system PL according to an instruction from the control system 71.

In the case using an iris stop which can continuously change the circular aperture size, the fourth driving system 75 sets the aperture size of the iris stop according to an instruction from the control system 71. Further, when necessary, the third driving system 74 changes the focal length of the zoom lens 7, whereby the size of the circular secondary light source can be changed appropriately. In this case, the turret rotates in response to the change in the size of the circular secondary light source, so that the circular aperture stop having a desirable size of opening is selected and positioned in the illumination optical path. Thus, while the loss in quantity of light is favorably suppressed in the forming and restricting of the circular secondary light source, various kinds of circular illumination can be carried out with the σ value being changed appropriately.

In the first modified example, as in the foregoing, actions of the diffraction optical elements (4a to 4c), a focal zoom lens 5, and zoom lens 7 can switch illumination conditions, i.e., can change the size and form of the illumination light at the pupil of the illumination optical system. The diffraction optical elements (4a to 4c), a focal zoom lens 5, and zoom lens 7 constitute an example of changing unit. Since the imaging optical system 12 and the projection optical system PL are configured so as to satisfy the above-mentioned conditional expression (1), favorable imaging performances can fully be exhibited while the apparatus is kept relatively small in the first modified example if a part of the illumination optical system (imaging optical system 12 or the like) is adjusted.

Figure 13:
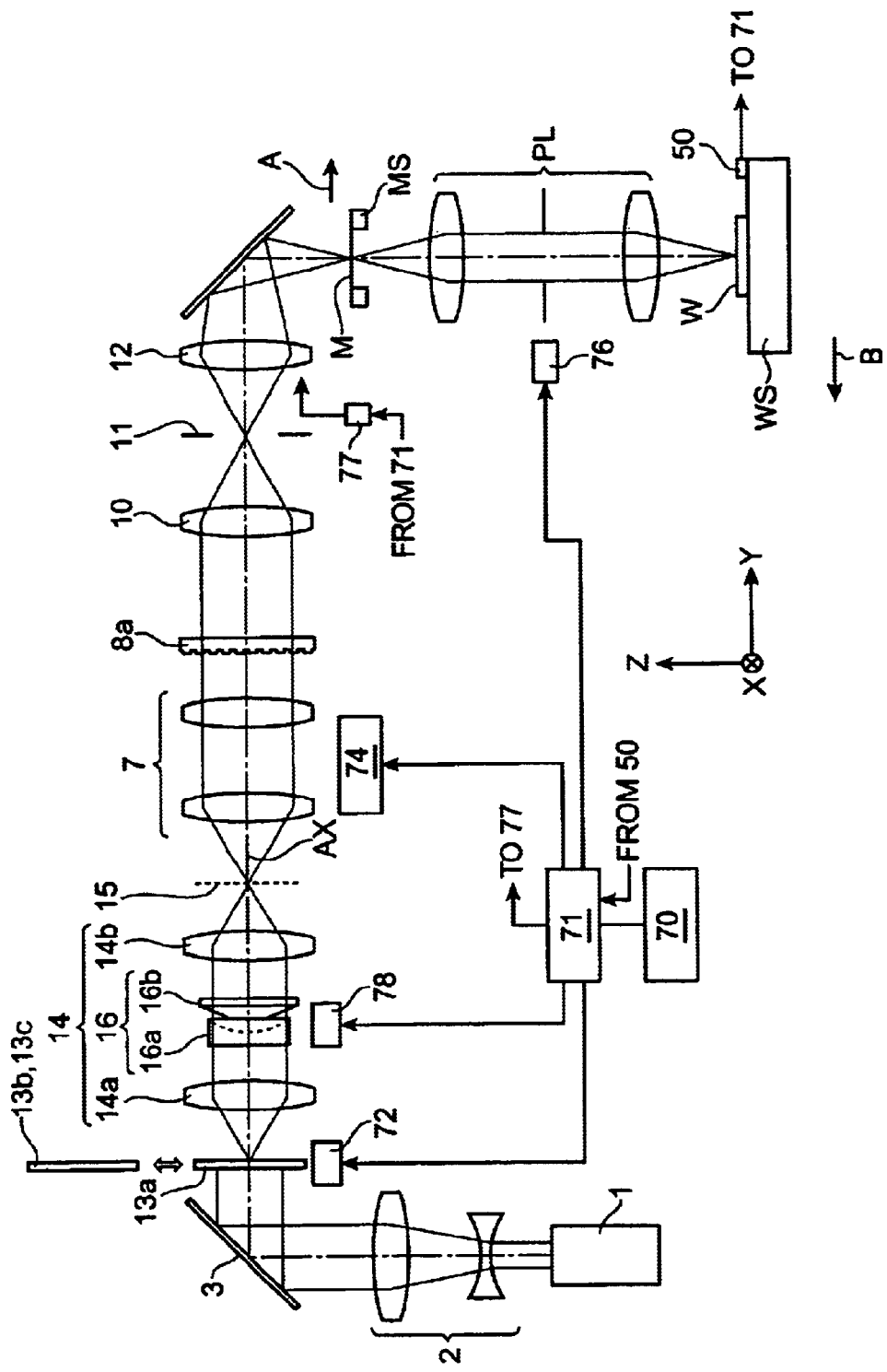
FIG. 13 is a view schematically showing the configuration of the exposure apparatus of normal exposure type in accordance with a second modified example of the embodiment.

FIG. 13 is a view schematically showing the configuration of an exposure apparatus of normal exposure type in accordance with the second modified example of the embodiment. The second modified example has a configuration similar to that of the first modified example but differs therefrom in the configuration between the bending mirror 3 and the zoom lens 7, and in the use of a microlens array 8a in place of the flyeye integrator 8. In the following, the second modified example will be explained while taking account of its differences from the first modified example. In FIG. 13, the illumination optical apparatus is set so as to carry out annular illumination.

In the second modified example, a substantially parallel luminous flux emitted from the light source 1 is made incident on a diffraction optical element 13a for annular illumination by way of the beam expander 2 and the bending mirror 3. The diffraction optical element 13a functions to form a annular optical intensity distribution in its far field (Fraunhofer diffraction area) when a parallel luminous flux having a rectangular cross section is incident thereon. The diffraction optical element 13a for annular illumination is configured so as to be freely inserted into and retracted from the illumination optical path, and switchable with a diffraction optical element 13b for quadrupolar illumination and a diffraction optical element 13c for circular illumination.

The luminous flux having traveled by way of the diffraction optical element 13a is made incident on an a focal lens (relay optical system) 14. The a focal lens 14 is an a focal system (an optical system with no focus) which is set such that its object-side focal position and the position of the diffraction optical element 14a substantially coincide with each other and that its image-side focal position and the position of a predetermined plane 15 indicated by the broken line in the drawing substantially coincide with each other. Here, the position of the predetermined plane 15 corresponds to the position where the microlens array 6 is installed in the first embodiment.

As a consequence, the substantially parallel luminous flux incident on the diffraction optical element 13a forms a annular optical intensity distribution at the pupil surface of the a focal lens 14 and then is emitted as a substantially parallel luminous flux from the a focal lens 14. Disposed between a front-side lens group 14a and a rear-side lens group 14b in the a focal lens 14 is a conical axicon system (which will hereinafter be simply referred to as axicon) as an optical system for making the annular ratio variable, whose detailed configuration and operations will be explained later. In the following, for simplifying the explanation, basic configuration and operations of the second modified example will be explained while ignoring the operations of the conical axicon 16.

By way of the zoom lens (variable power optical system) 7 for changing the σ value, the luminous flux having passed the a focal lens 14 is made incident on the microlens array 8a acting as an optical integrator. The predetermined plane is positioned near the object-side focal position of the zoom lens 7, whereas the entrance surface of the microlens array 8a is disposed near the image-side focal position of the zoom lens 7. In other words, in the zoom lens 7, the predetermined plane 15 and the entrance surface of the microlens array 8a are substantially arranged into a Fourier transform relationship, whereby the pupil surface of the a focal lens 14 and the entrance surface of the microlens array 8a are arranged substantially optically conjugate with each other.

Therefore, a annular illumination field centered at the optical axis AX, for example, is formed on the entrance surface of the microlens array 8a having a function similar to that of the flyeye integrator 8 as in the pupil surface of the a focal lens 14. The overall form of the annular illumination field changes similarly depending on the focal length of the zoom lens 7. Each microlens constituting the microlens array 8a has a rectangular cross section similar to the form of the illumination field to be formed on the mask M (and consequently the form of the exposure area to be formed on the wafer W). The luminous flux incident on the microlens array 8a is two-dimensionally divided by a number of minute lenses, and then a secondary light source having an optical intensity distribution substantially the same as that of the illumination field formed by the luminous flux incident on the microlens array 8a, i.e., a annular secondary light source, is formed at the image-side focal plane (and consequently at the pupil of the illumination optical system).

In the second modified example, as explained in the foregoing, the conical axicon 16 is disposed in the optical path between the front-side lens group 14a and the rear-side lens group 14b in the a focal lens 14. The conical axicon 16 comprises, successively from the light source side, a first prism member 16a having a planar surface directed onto the light source side and a concave conical refracting surface directed onto the mask side, and a second prism member 16b having a planar surface directed onto the mask side and a convex conical refracting surface directed onto the light source side. The concave conical refracting surface of the first prism member 16a and the convex conical refracting surface of the second prism member 16b are formed complementarily so as to be able to abut against each other.

At least one of the first prism member 16a and second prism member 16b is configured movable along the optical axis AX, whereas the distance between the concave conical refracting surface of the first prism member 16a and the convex conical refracting surface of the second prism member 16b is variable. As will be explained later, the conical axicon 16 is configured so as to be freely inserted into and retracted from the illumination optical system while being switchable with a pyramidal axicon which is not depicted. The changing of the gap in the conical axicon 16, the changing of the gap in the pyramidal axicon, and the switching between the conical axicon 16 and the pyramidal axicon are carried out by a driving system 78 which operates according to an instruction from the control system 71.

Here, in the state where the concave conical refracting surface of the first prism member 16a and the convex conical refracting surface of the second prism member 16b are in contact with each other, the conical axicon 16 functions as a plane parallel plate, thus exerting no influence upon the formed annular secondary light source. If the concave conical refracting surface of the first prism member 16a and the convex conical refracting surface of the second prism member 16b are separated from each other, however, then the conical axicon 16 functions as a so-called beam expander. Therefore, the angle of incidence of the luminous flux onto the predetermined plane 15 changes as the gap in the conical axicon 16 changes.

Thus, if the gap in the conical axicon 16 is changed in the annular illumination of the second modified example, then both of the outer and inner diameters of the annular secondary light source change without altering the width of the annular secondary light source (½ of the difference between the outer and inner diameters). In other words, both of the annular annular and size (outer diameter) of the annular secondary light source change under the action of the conical axicon 16 without altering its width. If the focal length of the zoom lens 7 changes, by contrast, then the overall form of the annular secondary light source changes similarly. In other words, both of the width and size (outer diameter) of the annular secondary light source change under the action of the zoom lens 7 without altering the annular ratio.

The quadrupolar illumination obtained when the diffraction optical element 13b for quadrupolar illumination is set in place of the diffraction optical element 13a for annular illumination in the illumination optical path will now be explained in brief. In this case, the substantially parallel luminous flux incident on the diffraction optical element 13b forms a quadrupolar optical intensity distribution at the pupil surface of the a focal lens 14 and then is emitted as a substantially parallel luminous flux from the a focal lens 14. At the entrance surface of the microlens array 8a, by way of the zoom lens 7, the luminous flux having passed the a focal lens 14 forms a quadrupolar illumination field composed of four illumination fields which are ecentric with respect to the optical axis AX. As a result, a secondary light source having an optical intensity distribution substantially the same as that of the illumination field formed by the incident luminous flux, i.e., a quadrupolar secondary light source composed of four substantially planar light sources eccentric with respect to the optical axis AX, is formed at the image-side focal plane of the microlens array 8a (and consequently at the pupil surface of the illumination optical system).

In the quadrupolar illumination in the second modified example, a pyramidal axicon is set in place of the conical axicon 16 in the illumination optical path. Though the pyramidal axicon has a form similar to the conical axicon 16, a pair of refracting surfaces are each formed like a quadrilateral pyramid in the pyramidal axicon whereas a pair of refracting surfaces are formed conical in the conical axicon. Namely, the refracting surfaces of the pyramidal axicon correspond to pyramidal surfaces (side faces excluding the bottom face) in a square pyramid symmetrical about the optical axis AX, whereas the two refracting surfaces are substantially parallel to each other.

Therefore, if the gap in the pyramidal axicon is changed in the quadrupolar illumination in the second modified example, then the center position of the four planar light sources constituting the quadrupolar secondary light source moves along the diametric direction of the circle centered at the optical axis AX without changing their form and size. In other words, both of the annular ratio and size (outer diameter) of the quadrupolar secondary light source change under the action of the pyramidal axicon without altering its width. If the focal length of the zoom lens 7 changes, by contrast, then the overall form of the quadrupolar secondary light source changes similarly. In other words, both of the width and size (outer diameter) of the quadrupolar secondary light source change under the action of the zoom lens 7 without altering the annular ratio.

The normal circular illumination obtained when the diffraction optical element 13c for circular illumination is set in place of the diffraction optical element 13a for annular illumination or diffraction optical element 13b for quadrupolar illumination in the illumination optical path will now be explained in brief. In this case, the substantially parallel luminous flux incident on the diffraction optical element 13c forms a circular optical intensity distribution at the pupil surface of the a focal lens 13 and then is emitted from the a focal lens 14 as a substantially parallel luminous flux. At the entrance surface of the microlens array 8a, by way of the zoom lens 7, the luminous flux having passed the a focal lens 14 forms a circular illumination field centered at the optical axis AX, for example.

As a result, a secondary light source having an optical intensity distribution substantially the same as that of the illumination field formed by the incident luminous flux, i.e., a circular secondary light source, is formed at the image-side focal plane of the microlens array 8a (i.e., the pupil of the illumination optical system). In the circular illumination of the second modified example, its overall form similarly changes if the focal length of the zoom lens 7 changes. In other words, the size (outer diameter) of the circular secondary light source can be altered if the focal length of the zoom lens 7 is changed in the circular illumination of the second modified example.

In the examples shown in FIGS. 12 and 13, detection signals from the photoelectric detector 50 installed at one end of the wafer stage WS are fed into the control system 71, whereby optical characteristics (aberrations, illumination characteristics, and the like) concerning the exposure optical system including both of the illumination optical system and projection optical system, the illumination optical system, or the imaging optical system 12 are measured. According to the result of measurement obtained by way of the photoelectric detector 50, the control system 71 outputs a control signal to a sixth driving system 77, and moves a part of optical members constituting the imaging optical system 12 (to rotate about the optical axis, travel in the optical axis direction, travel or tilt in a direction orthogonal to the optical axis, or the like) by way of the sixth driving system 77. As a consequence, illumination characteristics of the illumination optical system are adjusted. The imaging optical system 12 may use the optical system whose lens data are shown in Table 1, and the projection optical system PL may use the optical system whose lens data are shown in Tables 2 to 4 in the examples shown in FIGS. 12 and 13 as well. In this case, it is preferred that the above-mentioned conditional expression (1) be satisfied.

It is preferred that the method of adjusting the blind imaging optical system within the exposure apparatus (or method of adjusting the blind imaging optical system at the time of manufacturing an exposure apparatus) explained with reference to FIG. 5 and the adjusting method in the manufacturing of the exposure apparatus explained with reference to FIG. 7 be employed in the imaging optical system 12 and exposure apparatus in the examples shown in FIGS. 12 and 13 as well. It is more desirable that the above-mentioned conditional expression (1) be satisfied in this case as well.

Figure 14:
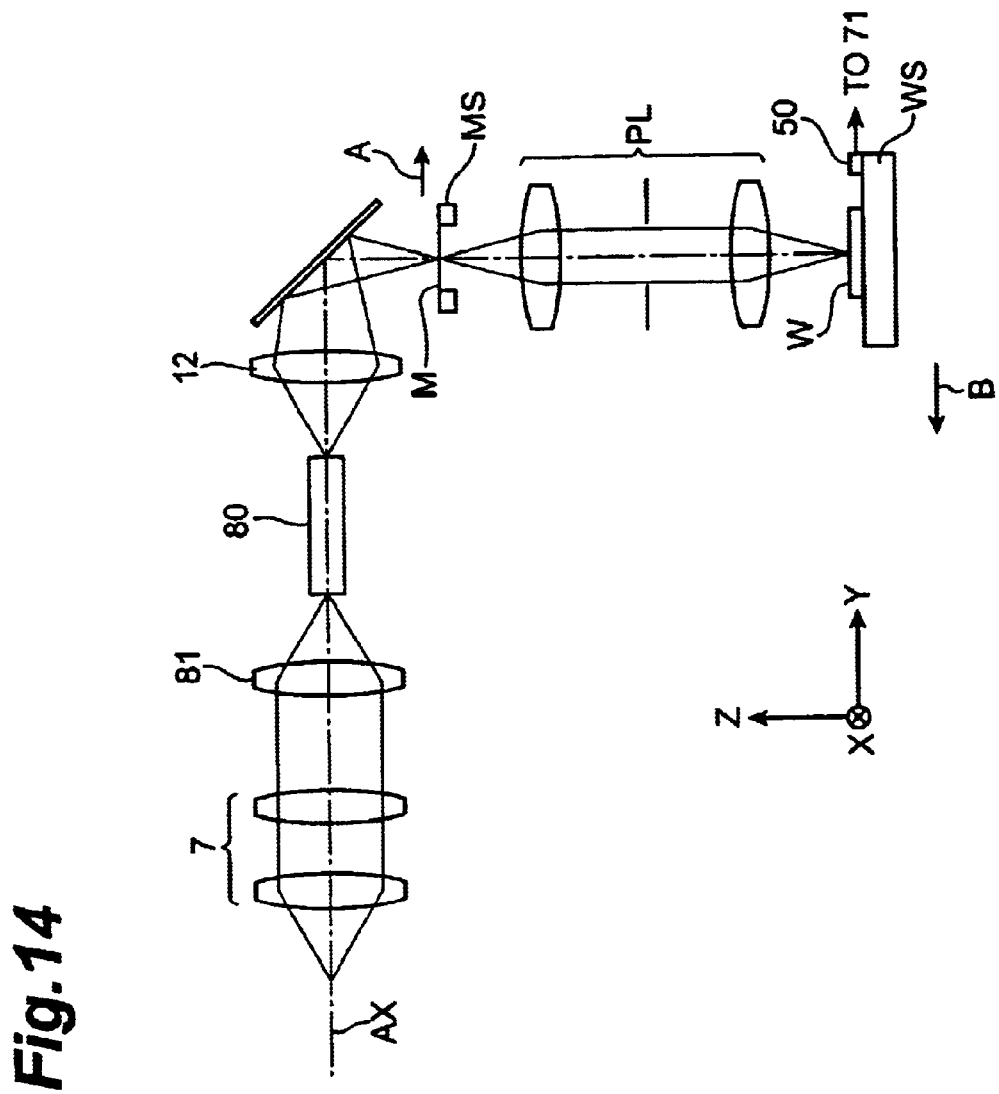
FIG. 14 is a view schematically showing the configuration of the exposure apparatus of normal exposure type in accordance with a third modified example of the embodiment.

FIG. 14 is a view schematically showing the configuration of the exposure apparatus of normal exposure type in accordance with a third modified example of the embodiment. The third modified example has a configuration similar to that of the first and second modified examples. However, they basically differ from each other in that the wavefront dividing type flyeye integrator 8 or microlens array 8a is used as the optical integrator in the first and second modified example, whereas an internal reflection type rod-shaped optical integrator 80 is used as the optical integrator in the third modified example. In FIG. 14, elements on the light source side from the zoom lens 7 in the first and second modified zoom lens 7, elements concerning drive control, and the like are not depicted. In the following, the third modified example will be explained while taking account of its differences from the first and second modified examples.

In the third modified example, in response to the fact that the rod-shaped integrator 80 is used in place of the flyeye integrator 8 or microlens array 8a, a condenser lens 81 is disposed in the optical path between the zoom lens 7 and the rod-shaped integrator 80, so as to eliminate the condenser optical system 10. Here, the composite optical system composed of the zoom lens 7 and the condenser lens 81 makes the image-side focal plane of the microlens array 6 in the first modified example and the entrance surface of the rod-shaped integrator 80 substantially optically conjugate with each other.

The rod-shaped integrator 80 is an internal reflection type glass rod made of a glass material such as silica glass or fluorite. By utilizing the total reflection at the boundary surface between the inside and outside, i.e., at the inner surface, the rod-shaped integrator 80 forms light source images whose number corresponds to the number of internal reflections along a plane, parallel to the rod entrance surface, including the light-converging point. While most of the light source images formed are virtual images, only the light source image at the center (light-converging point) becomes a real image. Namely, the luminous flux incident on the rod-shaped integrator 80 is split into angular directions upon the internal reflection, whereby a secondary light source comprising a number of light source images is formed a long a plane, parallel to the entrance surface thereof, including the light-converging point. The luminous flux from the secondary light source formed by the rod-shaped integrator 80 on its entrance side is superposed at its exit surface, and then, by way of the imaging optical system 12, illuminates the mask M formed with a predetermined pattern. Therefore, a rectangular illumination field (shaped like a rectangle whose ratio of the shorter side to longer side is 1:3, for example) similar to the cross-sectional form of the rod-shaped integrator 80 is formed on the mask M. In the scanning exposure of the third modified example, the mask M and wafer W are moved relative to the projection optical system PL along a scanning direction (Y direction) optically corresponding to the shorter side direction (Z direction) in the cross-sectional form of the rod-shaped integrator 80 as an optical integrator.

Though the examples shown in FIGS. 12 and 13 relate to a case where the diffraction optical element (4b, 13b) for forming a quadrupolar luminous flux is set into the illumination optical path in order to effect quadrupolar illumination as one kind of multipolar illumination, bipolar illumination can be effected if a diffraction optical element for forming a bipolar luminous flux is set in place of the diffraction optical element (4b, 13b) for forming a quadrupolar luminous flux. Namely, assuming N to be an integer of 2 or greater, N-polar illumination (multipolar illumination) can be carried out if a diffraction optical element for forming an N-polar luminous flux (a diffraction optical element for forming a multipolar luminous flux) is set into the illumination optical path.

While at least one of the size and form of illumination light at the pupil of the illumination optical system is made variable by the cooperation of the diffraction optical element (4a, 4b, 4c), the zoom lens (variable power optical system) 5 for changing the annular ratio, and the σ-variable zoom lens 7 in the foregoing example shown in FIG. 12, it is preferred that at least one of a number of optical members constituting the blind imaging optical system 12 be adjusted (moved, tilted, or shifted) in order to adjust (correct) the change (deterioration) in optical characteristics of the illumination optical system, such as the blind imaging optical system 12, due to the variation. In this case, optical systems other than the blind imaging optical system 12 in the illumination optical system may also be adjusted as a matter of course.

While at least one of the size and form of illumination light at the pupil of the illumination optical system is made variable by the cooperation of the diffraction optical element (13a, 13b, 13c), the optical system 14 for changing the annular ratio, and the σ-variable zoom lens 7 in the foregoing example shown in FIG. 13, it is preferred that at least one of a number of optical members constituting the blind imaging optical system 12 be adjusted (moved, tilted, or shifted) in order to adjust (correct) the change (deterioration) in optical characteristics of the illumination optical system, such as the blind imaging optical system 12, due to the variation. In this case, optical systems other than the blind imaging optical system 12 in the illumination optical system may also be adjusted as a matter of course.

Figure 15:
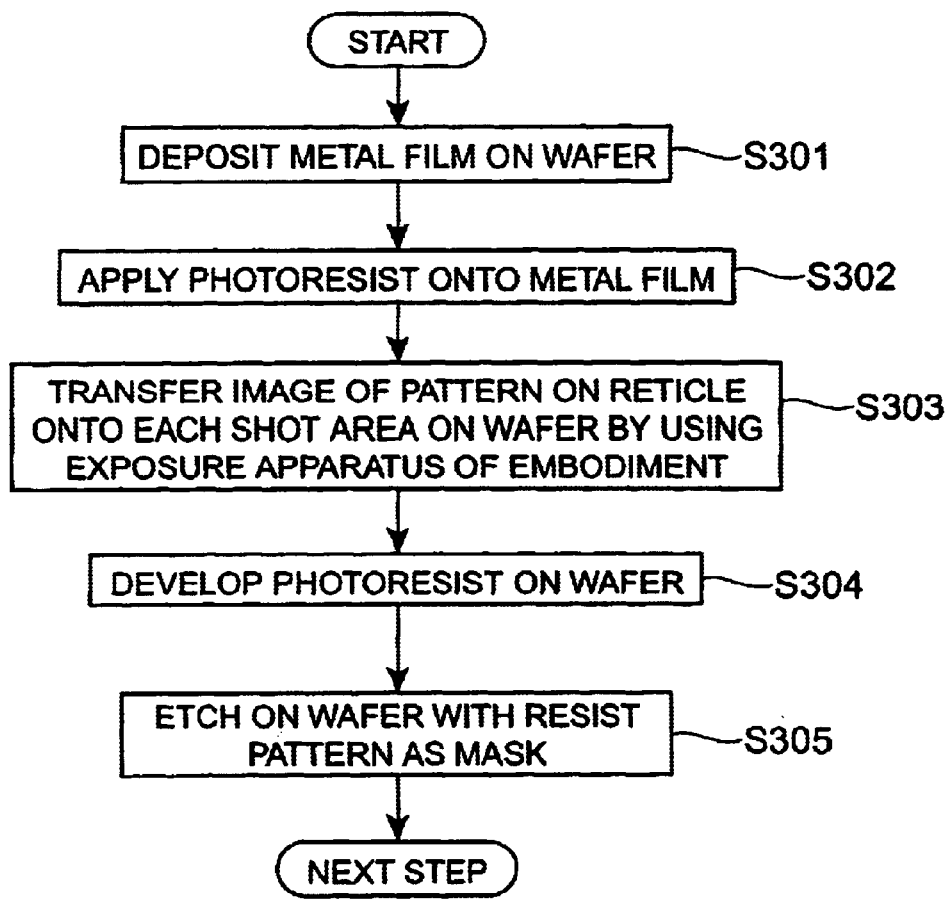
FIG. 15 is a flowchart of a technique for yielding a semiconductor device as a microdevice by forming a predetermined circuit pattern in a wafer or the like as a photosensitive substrate while using the exposure apparatus in accordance with the present invention.

In the embodiment shown in FIG. 1 or the modified examples shown in FIGS. 12 to 14, after the step of adjusting each optical member constituting the illumination optical system is completed, a mask (reticle) is illuminated with the illumination optical system (illumination step), and a transfer pattern formed on the reticle is exposed to a photosensitive substrate in an overlapping manner or a normal manner by use of the projection optical system (exposure step) as in the foregoing, whereby a microdevice (such as a semiconductor device, a liquid crystal display device, and a thin film magnetic head) can be manufactured. In the following, an example of techniques for yielding a semiconductor device as a microdevice by forming a predetermined circuit pattern on a wafer or the like acting as a photosensitive substrate while using the exposure apparatus shown in FIG. 1 or FIGS. 12 to 14 will be explained with reference to the flowchart of FIG. 15.

First, a metal film is deposited on a single lot of wafer (S301). Subsequently, a photoresist is applied onto the metal film on the single lot of wafer (S302). Then, by use of the exposure apparatus shown in FIG. 1 or FIGS. 12 to 14, images of the pattern on the mask (reticle) are successively exposed and transferred to individual shot areas on the single lot of wafer by way of the projection optical system (projection optical unit) (S303). Thereafter, the photoresist on the wafer in the single lot of wafer is developed (S304), and then etching is carried out on the single lot of wafer while a resist pattern is used as a mask (S305). As a consequence, a circuit pattern corresponding to the pattern on the mask is formed in each shot area on each wafer. Thereafter, circuit patterns on upper layers are formed, and so forth, whereby a device such as a semiconductor device is manufactured. According to the semiconductor device manufacturing method mentioned above, a semiconductor device having quite minute circuit patterns can be obtained with a favorable throughput.

Figure 16:
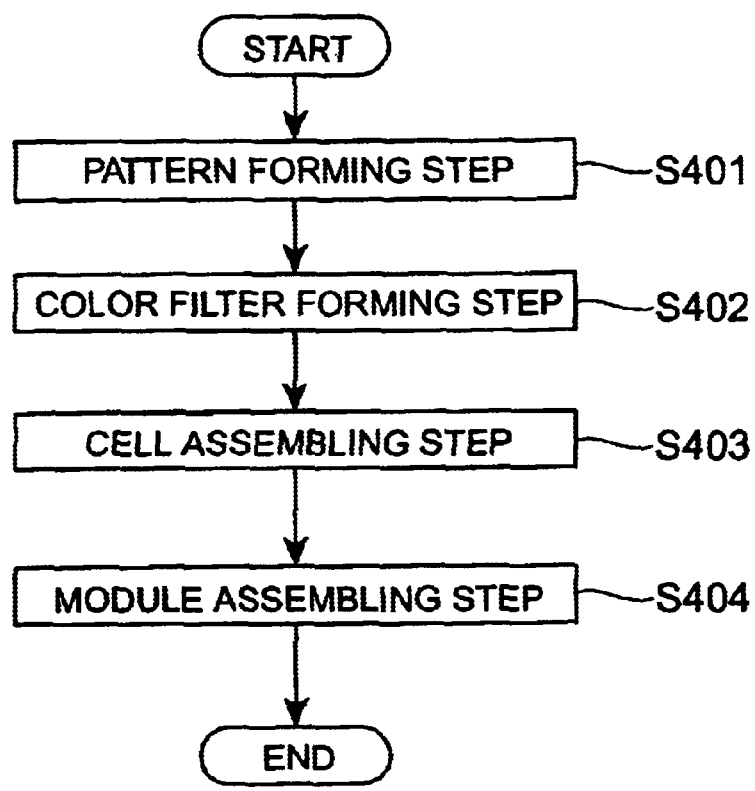
FIG. 16 is a flowchart of a technique for yielding a liquid crystal display device as a microdevice by forming a predetermined pattern (a circuit pattern, an electrode pattern, or the like) on a plate (glass substrate) while using the exposure apparatus in accordance with the present invention.

In the exposure apparatus shown in FIG. 1 or FIGS. 12 to 14, a liquid crystal display device as a microdevice can also be obtained if a predetermined pattern (a circuit pattern, an electrode pattern, or the like) is formed on a plate P (e.g., a glass substrate). In the following, an example of techniques at this time will be explained with reference to the flowchart of FIG. 16. In FIG. 16, a so-called photolithography step, in which a pattern of a reticle is transferred and exposed to a photosensitive substrate (a glass substrate coated with a resist, or the like) by using the exposure apparatus shown in FIG. 1 or FIGS. 12 to 14, is executed at a pattern forming step (S401). A predetermined pattern is formed in the resist on the photosensitive substrate by this photolithography step. Thereafter, thus exposed plate P is subjected to individual steps such as a developing step, an etching step, and a resist stripping step, whereby a predetermined pattern including a number of electrodes and the like are formed on the plate P.

In a color filter forming step (S402), a color filter in which a number of groups of three dots corresponding to R (Red), G (Green), and B (Blue) are arranged in a matrix or a color filter in which a plurality of groups of filters of three stripes of R, G, and B are arranged in a horizontal scanning line direction is formed.

Subsequently, a cell assembling step (S403) is executed. In the cell assembling step, the plate P having a predetermined pattern obtained at the pattern forming step (S401), the color filter obtained at the color filter forming step (S402), and the like are used so as to assemble a liquid crystal panel (liquid crystal cell). In the cell assembling step, a liquid crystal is injected between the substrate having a predetermined pattern obtained at the pattern forming step and the color filter obtained at the color filter forming step, for example, so as to manufacture a liquid crystal panel (liquid crystal cell).

Subsequently, at a module assembling step (S404), parts such as an electric circuit for causing thus assembled liquid crystal panel (liquid crystal cell) to carry out display operations, a backlight, and the like are attached to the liquid crystal panel, so as to accomplish a liquid crystal display device. According to the liquid crystal display device manufacturing method mentioned above, a liquid crystal display device having quite minute circuit patterns can be obtained with a favorable throughput.

Though the above-mentioned embodiment exemplifies the so-called step-and-repeat system in which exposure is carried out in a state where the reticle and the plate P are substantially stood still, the present invention is naturally applicable to other exposure apparatus of step-and-scan type having a reticle blind as well. Also, the exposure light wavelength is not restricted to g-line, h-line, i-line, KrF excimer laser light, ArF excimer laser light, $F_2$ laser light, and the like in particular as a matter of course.

What is claimed is:

1. An exposure apparatus for exposing a transfer pattern of a mask onto a photosensitive substrate in an overlapping manner, so as to expose a pattern larger than said transfer pattern of said mask onto said photosensitive substrate;

said exposure apparatus comprising:
  a light source unit for supplying illumination light;
  an illumination optical system for guiding said illumination light to said mask having said transfer pattern;
said illumination optical system comprising:
  an illumination area defining unit, disposed at a position substantially optically conjugate with said mask, for defining a predetermined area corresponding to an illumination area to be formed on said mask; and
  an imaging optical system, between the illumination area defining unit and the mask, for forming said illumination area on said mask by projecting said predetermined area defined by said illumination area defining unit onto said mask;
said exposure apparatus further comprising:
  an adjusting unit for correcting at least one of aberrations of said imaging optical system so as to improve an exposure characteristic in an overlapping exposure area formed on said photosensitive substrate.

2. An exposure apparatus according to claim 1, further comprising a projection optical system for projecting an image of said transfer pattern of said mask onto an exposure area on said photosensitive substrate.

3. An exposure apparatus according to claim 2, wherein said exposure apparatus satisfies an expression of:

$$0.01 < NA1/(NA2 \times \beta) < 6$$

where NA1 is the maximum numerical aperture of said imaging optical system on said illumination area defining unit side, $\beta$ is the absolute value of imaging magnification of said imaging optical system, and NA2 is the maximum numerical aperture of said projection optical system on said photosensitive substrate side.

4. An exposure apparatus according to claim 3, wherein said exposure apparatus satisfies an expression of:

$$0.01 < NA1/(NA2 \times \beta) < 4.$$

5. An exposure apparatus according to claim 1, wherein said illumination area defining unit causes said illumination area formed on said mask to become variable.

6. An exposure apparatus according to claim 1, wherein said adjusting unit adjusts at least one of imaging magnification, distortion, curvature of field, astigmatism, spherical aberration, coma, image surface tilting, decentering distortion, decentering coma, and decentering astigmatic difference in said imaging optical system.

7. An exposure apparatus according to claim 1, wherein said adjusting unit adjusts at least one of an illuminating angle with respect to a center of gravity of a luminous flux onto said mask or onto said photosensitive substrate, and unevenness of illumination on said mask or on said photosensitive substrate.

8. An exposure apparatus according to claim 1, wherein said adjusting unit carries out adjustment by at least one of moving at least one of said illumination area defining unit and at least a part of said imaging optical system along an optical axis, shifting at least one of said illumination area defining unit and at least a part of said imaging optical system within a plane orthogonal to said optical axis, tilting at least one of said illumination area defining unit and at least a part of said imaging optical system with respect to said optical axis, and rotating at least one of said illumination area defining unit and at least a part of said imaging optical system about said optical axis.

9. An exposure apparatus according to claim 1, wherein said adjusting unit moves or tilts each of a first lens or first lens group for adjusting said optical characteristic, and a second lens or second lens group for correcting an optical characteristic deteriorated in accordance with the adjustment of said optical characteristic.

10. An exposure apparatus according to claim 1, further comprising a measuring unit for measuring an optical characteristic in said illumination area formed on said mask or in said exposure area formed on said photosensitive substrate so as to obtain an optical characteristic of said imaging optical system.

11. An exposure apparatus according to claim 1, wherein said adjusting unit adjusts at least one of imaging magnification, distortion, curvature of field, astigmatism, spherical aberration, coma, image surface tilting, decentering distortion, decentering coma, and decentering astigmatic difference in said imaging optical system by at least one of moving at least one lens constituting said imaging optical system along an optical axis, shifting said at least one lens along a plane orthogonal to said optical axis, tilting said at least one lens with respect to said optical axis, and rotating said at least one lens about said optical axis.

12. An exposure apparatus according to claim 1, further comprising a measuring unit for measuring said optical characteristic;

wherein said adjusting unit carries out said adjustment based on a result of measurement obtained by said measuring unit.

13. An exposure apparatus according to claim 1, further comprising a moving unit for moving at least one of said photosensitive substrate and said mask to a position where exposure partly overlaps an already exposed area so as to carry out said exposure in an overlapping manner.

14. An exposure apparatus for exposing a transfer pattern of a mask onto a photosensitive substrate;

said exposure apparatus comprising:
  a light source unit for supplying illumination light;
  an illumination optical system for guiding said illumination light supplied by said light source unit to said mask having said transfer pattern; and
  a projection optical system for projecting an image of said transfer pattern of said mask onto an exposure area formed on said photosensitive substrate;
said illumination optical system comprising:
  an illumination area defining unit, disposed at a position substantially optically conjugate with said mask, for defining a predetermined area corresponding to an illumination area to be formed on said mask, and
  an imaging optical system for forming said illumination area on said mask by projecting said predetermined area defined by said illumination area defining unit onto said mask;
said exposure apparatus further comprising:
  an adjusting unit for adjusting an optical characteristic in said illumination area formed on said mask or in said exposure area formed on said photosensitive substrate;

said exposure apparatus satisfying an expression of:

$$0.01 < NA1/(NA2 \times \beta) < 6$$

where NA1 is the maximum numerical aperture of said imaging optical system on said illumination area defining unit side, β is the absolute value of imaging magnification of said imaging optical system, and NA2 is the maximum numerical aperture of said projection optical system on said photosensitive substrate side.

15. An exposure apparatus according to claim 14, wherein said exposure apparatus satisfies an expression of:

$$0.01 < NA1/(NA2 \times \beta) < 4.$$

16. An exposure apparatus according to claim 14, wherein said adjusting unit adjusts at least one of imaging magnification, distortion, curvature of field, astigmatism, spherical aberration, coma, image surface tilting, decentering distortion, decentering coma, and decentering astigmatic difference in said imaging optical system.

17. An exposure apparatus according to claim 14, wherein said adjusting unit adjusts at least one of an illuminating angle with respect to a center of gravity of a luminous flux onto said mask or onto said photosensitive substrate, and unevenness of illumination on said mask or on said photosensitive substrate.

18. An exposure apparatus according to claim 14, wherein said adjusting unit carries out adjustment by at least one of moving at least one of said illumination area defining unit and at least a part of said imaging optical system along an optical axis, shifting at least one of said illumination area defining unit and at least a part of said imaging optical system within a plane orthogonal to said optical axis, tilting at least one of said illumination area defining unit and at least a part of said imaging optical system with respect to said optical axis, and rotating at least one of said illumination area defining unit and at least a part of said imaging optical system about said optical axis.

19. An exposure apparatus according to claim 14, wherein said adjusting unit moves or tilts each of a first lens or first lens group for adjusting said optical characteristic, and a second lens or second lens group for correcting an optical characteristic deteriorated in accordance with the adjustment of said optical characteristic.

20. An exposure apparatus according to claim 14, further comprising a measuring unit for measuring an optical characteristic in said illumination area formed on said mask or in said exposure area formed on said photosensitive substrate so as to obtain an optical characteristic of said imaging optical system.

21. An exposure apparatus according to claim 14, wherein said adjusting unit adjusts at least one of imaging magnification, distortion, curvature of field, astigmatism, spherical aberration, coma, image surface tilting, decentering distortion, decentering coma, and decentering astigmatic difference in said imaging optical system by at least one of moving at least one lens constituting said imaging optical system along an optical axis, shifting said at least one lens along a plane orthogonal to said optical axis, tilting said at least one lens with respect to said optical axis, and rotating said at least one lens about said optical axis.

22. An exposure apparatus according to claim 14, further comprising a measuring unit for measuring said optical characteristic;
wherein said adjusting unit carries out said adjustment based on a result of measurement obtained by said measuring unit.

23. An exposure apparatus according to claim 14, further comprising a changing unit for changing at least one of size and form of said illumination light at a pupil of said illumination optical system.

24. An exposure apparatus according to claim 23, wherein said adjusting unit adjusts said optical characteristic changed by said changing unit.

25. An exposure apparatus according to claim 14, further comprising a scanning unit for moving said mask and said photosensitive substrate relative to said projection optical system along a predetermined scanning direction so as to expose an image of said transfer pattern of said mask onto said photosensitive substrate in a scanning manner;

said illumination optical system including:
an optical integrator, disposed between said changing unit and said illumination area defining unit, for illuminating said mask with illumination light by way of said changing unit;
said optical integrator being arranged such that a direction optically corresponding to a shorter side direction of a cross section of said optical integrator perpendicular to an optical axis or a shorter side direction of a cross section of a number of optical elements constituting said optical integrator perpendicular to said optical axis coincides with said scanning direction.

26. An exposure apparatus comprising:
an illumination optical system including an illumination area forming optical system for forming an illumination area on a mask having a predetermined pattern;
a projection optical system for projecting a pattern image of said mask onto a photosensitive substrate; and
an adjusting unit for adjusting said illumination optical system;
said exposure apparatus satisfying an expression of:

$$0.01 < NA1/(NA2 \times \beta) < 6$$

where NA1 is the maximum numerical aperture of said illumination area forming optical system on a light source side, β is the imaging magnification of said illumination area forming optical system, and NA2 is the maximum numerical aperture of said projection optical system on said photosensitive substrate side.

27. An exposure apparatus according to claim 26, wherein said adjusting unit adjusts at least one of a number of optical members constituting said illumination area forming optical system.

28. A method of manufacturing a microdevice by using the exposure apparatus of claim 1;
said method comprising:
an illumination step of illuminating said mask by using said illumination optical system; and
an exposure step of exposing a transfer pattern formed in said mask onto said photosensitive substrate.

29. A method of manufacturing a microdevice by using the exposure apparatus of claim 14;
said method comprising:
an illumination step of illuminating said mask by using said illumination optical system; and
an exposure step of exposing a transfer pattern formed in said mask onto said photosensitive substrate.

30. A method of manufacturing a microdevice,
said method comprising:
an illumination step of illuminating a mask having a transfer pattern with illumination light; and an exposure step of exposing said transfer pattern of said mask onto a photosensitive substrate in an overlapping manner;

said illumination step including:
an illumination area defining step of defining a predetermined area corresponding to an illumination area to be formed on a mask at a position substantially optically conjugate with said mask; and
an illumination area forming step of forming said illumination area on said mask by projecting said predetermined area onto said mask by using an imaging optical system that is located between the position where the predetermined area is defined and the mask;

said method further comprising:
an adjusting step of correcting at least one of aberrations of said imaging optical system prior to said exposure step so as to improve an exposure characteristic in an overlapping exposure area formed on said photosensitive substrate.

31. A method of manufacturing a microdevice according to claim 30, wherein said exposure step includes a projection step of projecting an image of said transfer pattern of said mask onto an exposure area on said photosensitive substrate by using a projection optical system.

32. A method of manufacturing a microdevice according to claim 31, said imaging optical system and said projection optical system satisfy an expression of:

$$0.01 < NA1/(NA2 \times \beta) < 6$$

where NA1 is the maximum numerical aperture of said imaging optical system on a side opposite from said mask side, β is the absolute value of imaging magnification of said imaging optical system, and NA2 is the maximum numerical aperture of said projection optical system on said photosensitive substrate side.

33. A method of manufacturing a microdevice according to claim 32, said method satisfies an expression of:

$$0.01 < NA1/(NA2 \times \beta) < 4.$$

34. A method of manufacturing a microdevice according to claim 30, wherein said illumination area defining step includes a changing step of changing said illumination area formed on said mask; and
wherein said adjusting step includes adjusting an optical characteristic of said imaging optical system according to a change in said illumination area caused by said changing step.

35. A method of manufacturing a microdevice according to claim 30, further comprising a measuring step of measuring an optical characteristic in said illumination area formed on said mask or in an exposure area formed on said photosensitive substrate;
wherein said adjusting step includes adjusting an optical characteristic of said imaging optical system according to a result of measurement obtained by said measuring step.

36. A method of manufacturing a microdevice;
said method comprising:
an illumination step of illuminating a mask having a transfer pattern with illumination light; and
an exposure step of exposing said transfer pattern of said mask onto a photosensitive substrate;
said exposure step including a projection step of projecting said transfer pattern of said mask onto said photosensitive substrate by using a projection optical system;

said illumination step including:
an illumination area defining step of defining a predetermined area corresponding to an illumination area to be formed on said mask at a position substantially optically conjugate with said mask; and
an illumination area forming step of forming said illumination area on said mask by projecting said predetermined area onto said mask by using an imaging optical system;

said method satisfying an expression of:

$$0.01 < NA1/(NA2 \times \beta) < 6$$

where NA1 is the maximum numerical aperture of said imaging optical system on a side opposite from said mask side, β is the absolute value of imaging magnification of said imaging optical system, and NA2 is the maximum numerical aperture of said projection optical system on said photosensitive substrate side;

said method further comprising an adjusting step of adjusting an optical characteristic of said imaging optical system prior to said exposure step.

37. A method of manufacturing a microdevice according to claim 36, said method satisfies an expression of:

$$0.01 < NA1/(NA2 \times \beta) < 4.$$

38. A method of manufacturing a microdevice according to claim 36, wherein said illumination area defining step includes a changing step of changing said illumination area formed on said mask; and
wherein said adjusting step includes adjusting an optical characteristic of said imaging optical system according to a change in said illumination area caused by said changing step.

39. A method of manufacturing a microdevice according to claim 36, further comprising a measuring step of measuring an optical characteristic in said illumination area formed on said mask or in an exposure area formed on said photosensitive substrate;
wherein said adjusting step includes adjusting an optical characteristic of said imaging optical system according to a result of measurement obtained by said measuring step.

40. A method of manufacturing a microdevice according to claim 36, wherein said illumination step includes a changing step of changing at least one of the size and form of illumination light at a pupil of an illumination optical system.

41. A method of manufacturing a microdevice according to claim 40, wherein said adjusting step includes a step of adjusting said optical characteristic changed by said changing step.

42. A method of manufacturing a microdevice according to claim 36, wherein said illumination step includes a uniform illumination step of uniformly illuminating said mask by way of an optical integrator; and
wherein said exposure step includes a scanning exposure step of exposing an image of said transfer pattern of said mask onto said photosensitive substrate in a scanning manner by moving said mask and said photosensitive substrate relative to said projection optical system along a predetermined direction optically corresponding to a shorter side direction of a cross section of said optical integrator perpendicular to an optical axis or a shorter side direction of a cross section of a number of optical elements constituting said optical integrator perpendicular to said optical axis.

43. A method of manufacturing a microdevice, said method comprising:
- illuminating a mask having a predetermined pattern by using an illumination optical system including an illumination area forming optical system for forming an illumination area on said mask;
- exposing a photosensitive substrate by using a projection optical system for projecting a pattern image of said mask onto said photosensitive substrate; and
- adjusting said illumination optical system;

said method satisfying an expression of:

$$0.01 < NA1/(NA2 \times \beta) < 6$$

where NA1 is the maximum numerical aperture of said illumination area forming optical system on a light source side, β is the imaging magnification of said illumination area forming optical system, and NA2 is the maximum numerical aperture of said projection optical system on said photosensitive substrate side.

44. A method of manufacturing a microdevice according to claim 43, further comprising a changing step of changing at least one of the size and form of illumination light at a pupil of said illumination optical system;
wherein said adjusting step adjusts said optical characteristic according to said changing step.

45. A method of manufacturing a microdevice according to claim 43, further comprising a changing step of changing said illumination area formed on said mask;
wherein said adjusting step adjusts said optical characteristic according to said changing step.

46. An exposure apparatus for exposing a transfer pattern of a mask onto a photosensitive substrate in an overlapping manner, so as to expose a pattern larger than said transfer pattern of said mask onto said photosensitive substrate;

said exposure apparatus comprising:
- a light source unit for supplying illumination light;
- an illumination optical system for guiding said illumination light to said mask having said transfer pattern;

said illumination optical system comprising:
- an illumination area defining unit, disposed at a position substantially optically conjugate with said mask, for defining a predetermined area corresponding to an illumination area to be formed on said mask; and
- an imaging optical system, between the illumination area defining unit and the mask, for forming said illumination area on said mask by projecting said predetermined area defined by said illumination area defining unit onto said mask;

said exposure apparatus further comprising:
- a first adjusting unit for adjusting at least one of an aberration of said imaging optical system so as to adjust an exposure characteristic in said illumination area formed on said mask or in an exposure area formed on said photosensitive substrate; and
- a second adjusting unit for adjusting at least one of a deterioration in evenness of illumination distribution on said photosensitive substrate and a deterioration in telecentricity on said photosensitive substrate.

47. A method of manufacturing a microdevice, said method comprising:
- an illumination step of illuminating a mask having a transfer pattern with illumination light; and
- an exposure step of exposing said transfer pattern of said mask onto a photosensitive substrate in an overlapping manner;

said illumination step including:
- an illumination area defining step of defining a predetermined area corresponding to an illumination area to be formed on a mask at a position substantially optically conjugate with said mask; and
- an illumination area forming step of forming said illumination area on said mask by projecting said predetermined area onto said mask by using an imaging optical system that is located between the position where the predetermined area is defined and the mask;

said method further comprising:
- a first adjusting step of adjusting at least one of an aberration of said imaging optical system prior to said exposure step; and
- a second adjusting step of adjusting at least one of a deterioration in evenness of illumination distribution on said photosensitive substrate and a deterioration in telecentricity on said photosensitive substrate prior to said exposure step.

48. A method according to claim 47, wherein said first adjusting step is performed prior to said second adjusting step.

49. A method according to claim 48, wherein:
said second adjusting step comprises a first sub-step of adjusting the deterioration in evenness of illumination distribution on said photosensitive substrate and a second sub-step of adjusting the deterioration in telecentricity on said photosensitive substrate prior to said exposure step; and
said first sub-step is performed prior to said second sub-step.

* * * * *